(12) United States Patent
Schuele et al.

(10) Patent No.: US 12,132,034 B2
(45) Date of Patent: Oct. 29, 2024

(54) FLUIDIC ASSEMBLY MICROLED MASS TRANSFER METHOD

(71) Applicant: eLux Inc., Vancouver, WA (US)

(72) Inventors: Paul J Schuele, Washougal, WA (US); Kenji Sasaki, West Lynn, OR (US); Kurt Ulmer, Vancouver, WA (US); Jong-Jan Lee, Camas, WA (US)

(73) Assignee: eLux, Inc., Vancouver, WA (US)

( * ) Notice: Subject to any disclaimer, the term of this patent is extended or adjusted under 35 U.S.C. 154(b) by 0 days.

(21) Appl. No.: 18/406,849

(22) Filed: Jan. 8, 2024

(65) Prior Publication Data

US 2024/0145443 A1 May 2, 2024

Related U.S. Application Data

(63) Continuation of application No. 17/101,016, filed on Nov. 23, 2020, now Pat. No. 11,894,350, which is a continuation-in-part of application No. 16/875,994, filed on May 16, 2020, now Pat. No. 11,296,059, which is a continuation-in-part of application No. 16/846,493, filed on Apr. 13, 2020, now Pat. No.
(Continued)

(51) Int. Cl.
| | |
|---|---|
| *H01L 25/075* | (2006.01) |
| *H01L 21/673* | (2006.01) |
| *H01L 21/70* | (2006.01) |
| *H01L 33/38* | (2010.01) |
| *H01L 33/48* | (2010.01) |

(52) U.S. Cl.
CPC .... *H01L 25/0753* (2013.01); *H01L 21/67316* (2013.01); *H01L 21/67343* (2013.01); *H01L 21/70* (2013.01); *H01L 33/38* (2013.01); *H01L 33/486* (2013.01); *H01L 2933/0033* (2013.01); *H01L 2933/0066* (2013.01)

(58) Field of Classification Search
CPC .................................................. H01L 21/67316
See application file for complete search history.

(56) References Cited

U.S. PATENT DOCUMENTS

| | | | |
|---|---|---|---|
| 2001/0031514 A1* | 10/2001 | Smith | G02F 1/1362 |
| | | | 257/E21.705 |
| 2002/0013008 A1* | 1/2002 | Sanaka | H01L 24/83 |
| | | | 438/106 |

(Continued)

*Primary Examiner* — Robert A Vetere
(74) *Attorney, Agent, or Firm* — Law Office of Gerald Maliszewski; Gerald Maliszewski

(57) ABSTRACT

A microLED mass transfer stamping system includes a stamp substrate with an array of trap sites, each configured with a columnar-shaped recess to temporarily secure a keel extended from a bottom surface of a microLED. In the case of surface mount microLEDs, the keel is electrically non-conductive. In the case of vertical microLEDs, the keel is an electrically conductive second electrode. The stamping system also includes a fluidic assembly carrier substrate with an array of wells having a pitch separating adjacent wells that matches the pitch separating the stamp substrate trap sites. A display substrate includes an array of microLED pads with the same pitch as the trap sites. The stamp substrate top surface is pressed against the display substrate, with each trap site interfacing a corresponding microLED site, and the microLEDs are transferred. Fluidic assembly stamp substrates are also presented for use with microLEDs having keels or axial leads.

8 Claims, 20 Drawing Sheets

Related U.S. Application Data 11,251,166, which is a continuation-in-part of application No. 16/727,186, filed on Dec. 26, 2019, now Pat. No. 11,145,787, which is a continuation-in-part of application No. 16/406,196, filed on May 8, 2019, now Pat. No. 10,643,981, which is a continuation-in-part of application No. 16/406,080, filed on May 8, 2019, now Pat. No. 10,804,426, which is a continuation-in-part of application No. 16/125,671, filed on Sep. 8, 2018, now Pat. No. 10,516,084, which is a continuation-in-part of application No. 15/838,536, filed on Dec. 12, 2017, now Pat. No. 10,242,977, which is a continuation-in-part of application No. 15/722,037, filed on Oct. 2, 2017, now Pat. No. 10,543,486, which is a continuation-in-part of application No. 15/691,976, filed on Aug. 31, 2017, now Pat. No. 10,535,640, which is a continuation-in-part of application No. 15/440,735, filed on Feb. 23, 2017, now Pat. No. 10,381,335, which is a continuation-in-part of application No. 15/416,882, filed on Jan. 26, 2017, now Pat. No. 10,446,728, which is a continuation-in-part of application No. 15/413,053, filed on Jan. 23, 2017, now Pat. No. 10,520,769, which is a continuation-in-part of application No. 15/412,731, filed on Jan. 23, 2017, now Pat. No. 10,418,527, which is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,266, filed on Jun. 29, 2016, now Pat. No. 10,249,599, and a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, which is a continuation-in-part of application No. 14/680,618, filed on Apr. 7, 2015, now Pat. No. 10,115,862, which is a continuation-in-part of application No. 14/530,230, filed on Oct. 31, 2014, now abandoned.

(56) References Cited

U.S. PATENT DOCUMENTS

| | | | |
|---|---|---|---|
| 2006/0220988 A1* | 10/2006 | Hillis | H01L 24/95 345/30 |
| 2013/0210194 A1* | 8/2013 | Bibl | H01L 24/75 438/107 |

* cited by examiner

FLUIDIC ASSEMBLY MICROLED MASS TRANSFER METHOD

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to micro-light emitting diode (micro-LED) displays and, more particularly, to systems and methods for the mass transfer of microLEDs in the process of display fabrication.

2. Description of the Related Art

A red-green-blue (RGB) display is composed of pixels that emit light at three wavelengths corresponding to the visible colors red, green, and blue. The RGB components of the pixel, each of which is referred to as a sub-pixel, are energized in a systematic way to additively produce the colors of the visible spectrum. There are several display types that produce the RGB images in different ways. Liquid crystal displays (LCDs) are the most prevalent technology and they produce RGB images by shining a white light source, typically a phosphor produced white LED, through a color filter of a subpixel. Some portions of the white light wavelengths are absorbed and some transmitted through the color filter. As a consequence, the efficiency of an LCD display may be less than 4% and the contrast ratio is limited by light leaking through the cell. Organic light emitting diode (OLED) displays produce RGB light by direct emission of each of those wavelengths of light at a subpixel level within the organic light emitting material. OLED pixels are direct emitting so the display contrast ratio is high, but the organic materials can be subject to long term degradation causing image burn-in.

A third display technology and the one addressed herein is the microLED display, which uses micro-sized (5 to 150 micron (um) major diameter) inorganic LEDs for the direct emission of light at the subpixel level. Inorganic microLED displays have a number of advantages over competing displays. When compared with LCD displays, the microLED display has very high contrast of over 50,000:1 and higher efficiency. Unlike the OLED display, inorganic LEDs do not suffer burn-in effects and the achievable brightness is significantly higher.

The current mainstream television with HDTV resolution has 2 million pixels (or 6 million subpixels) and the higher resolution 4K and 8K standards have 8 and 33 million pixels respectively. Even the relatively small displays used in tablets and cell phones have millions of pixels with display resolutions over 600 pixels per inch (ppi). Consequently, the manufacture of microLED based displays requires the low cost assembly of large area arrays of microLEDs at different pixel pitches to make a wide range of display sizes and resolutions. The most conventional technique for assembling microLED arrays is referred to as pick-and-place because each microLED is individually removed from a carrier and positioned on a substrate, as described below. Because each microLED is handled separately the assembly process is painfully slow.

FIGS. 1A through 1C depict a cross-sectional view of a GaN based LED stack (FIG. 1A), cross-sectional views of two fully processed vertical microLEDs (FIG. 1B) and a surface mount microLED (FIG. 1C) (prior art). The widespread adoption of gallium nitride (GaN) based high brightness LEDs for general lighting has created a sophisticated manufacturing system, so the microLEDs used for displays are based on investments made in that industry. GaN based LEDs that emit in the blue (around 440 nanometer (nm)) wavelength are fabricated in a complex series of high temperature metalorganic chemical vapor deposition (MOCVD) steps to produce the vertical LED structure shown in cross section in FIG. 1A. Fabrication takes place on a polished sapphire, silicon, or SiC substrate 50 to 200 millimeters (mm) in diameter. The surface is prepared by depositing an optional aluminum nitride (AlN) buffer layer plus undoped GaN to produce a crystalline surface with low defects and the lattice constant of GaN. The thickness and temperature of this initial deposition is tuned to compensate for the lattice mismatch between the substrate and GaN, with increasing thickness improving surface quality, so high efficiency devices are over about 3 µm thick. Because the MOCVD deposition process is complex and expensive, it is important that the microLED process is optimized for the most effective use of the full area of the growth wafer.

After the initial growth to prepare a crystalline GaN surface, the first LED layer is grown with Si doping added to produce n+ GaN for the cathode. Optionally, the stack can include layers tuned for electron injection and hole blocking. Next, a multiple quantum well (MQW) structure is deposited with alternating layers of indium gallium nitride (In$_x$Ga$_{1-x}$N) and GaN, where the indium content and the thickness of the layers determines the emission wavelength of the device. Increasing the indium content moves the emission peak to longer wavelengths, but also increases the stress due to lattice mismatch, so high-efficiency GaN devices cannot be made for red emission, and the efficiency of green emitting devices is lower than that of blue LEDs. After the MQW, the stack can include layers tuned for electron blocking and hole injection. The MOCVD layer sequence is completed by depositing magnesium (Mg)-doped GaN to form the p+ anode layer.

LEDs used for general lighting are much larger than those used for microLED displays (up to 3-4 mm per side versus 5 to 150 µm in diameter) so the patterning and electrode requirements are significantly different. The microLED is bonded to the substrate electrodes using either a solder material or an asymmetric conductive film (ACF), while large LEDs are often connected by wire bonding or solder paste on a lead frame. Because the microLEDs are quite small, more of the area of the MOCVD wafer is removed in the patterning process, decreasing the available emission area from each wafer. LED wafers are relatively expensive and the high-resolution processing for microLED fabrication further increases cost, so it is very important to use the emission area as efficiently as possible to minimize the cost of materials for a microLED display.

In the simplest process flow, a transparent conductive electrode is formed over the MOCVD stack by depositing a thin layer (a few nm) of nickel oxide (NiO$_x$) to match the p+ GaN work function, followed by a layer of indium tin oxide (ITO) that may be 50 to 300 nm thick. The completed stack is then patterned and etched, typically using a chlorine (Cl$_2$) based reactive ion etch (RIE) process, to produce individual microLEDs having about the smallest practical size and separation. In particular, the LED structure may be 3 to 5 µm thick to produce a high efficiency microLED, so the thickness of the structure imposes a limit on the minimum space which can be successfully etched.

After the LED outline is etched, additional processing is carried out to form an electrode on the anode as shown schematically in FIG. 1C. A passivation layer, typically of plasma-enhanced chemical vapor deposition (PECVD) silicon dioxide ($SiO_2$) or optionally including a thin atomic layer deposition (ALD) aluminum oxide ($Al_2O_3$) layer at the interface, is deposited to prevent leakage current, and a contact opening to the ITO layer is etched. The structure is completed by depositing an electrode stack including a solder material such as an alloy of indium/tin (In/Sn) or gold/germanium (Au/Ge).

FIG. 2A depicts microLEDs removed from the sapphire growth substrate using laser lift off (LLO). FIG. 2B depicts a pick-and-place process moving devices from the carrier wafer and positioning them on a display substrate. FIG. 2C depicts the connection of the microLED anode to a substrate electrode (FIG. 2C) (prior art). The completed microLEDs are bonded to a carrier wafer with an adhesive layer and removed from the sapphire growth substrate by laser lift off as shown schematically in FIG. 2A. Then individual microLEDs can be removed from the carrier by a pickup head and positioned on each sub-pixel where the anode electrode is bonded to form an electrical connection to a suitable electrode on the substrate as in FIG. 2B. The pixel is completed by coating the microLED with a suitable dielectric such as a photo patternable polyimide, and connections to the microLED cathode and a substrate electrode are opened. Metal interconnect is deposited and patterned to make the connection as shown in FIG. 2C.

LEDs that emit in the red around 630 nm are typically fabricated from AlGaInP on a GaAs substrate. Because GaAs is opaque, the laser lift off technique cannot be used to remove GaAs based LEDs from the growth substrate. Consequently, red LED devices are removed from the substrate either by completely etching the substrate or by using a selective wet etch (typically hydrogen chloride (HCl): acetic acid) to undercut and release the device. The device size (cross-section) is similar to that of GaN general lighting LED of 150 to 1000 microns. The AlGaInP LED process is described more fully in U.S. Pat. No. 10,804,426, which is incorporated herein by reference.

The pick-and-place assembly presented here has several important weaknesses that lead to high cost and lower yield. The assembly process is inherently serial, so assembling millions of microLEDs takes a long time and is expensive. The very small size of the microLED makes construction of a pickup head quite difficult, and it is possible that the edges of the mechanism can interfere with adjacent microLEDs in pickup or the reflector structure on assembly. The simple pick-and-place method shown can be expanded to a parallel process by using a mass transfer head which captures and transfers many microLEDs at the same time. However, the mass transfer methods can have poor yield because of defective microLEDs in the group being transferred, and because the pitch of the microLEDs is determined by the spacing of devices on the growth wafer.

FIGS. 3A to 3H depict steps in an exemplary mass transfer process (prior art). Mass transfer methods, where an array of many microLEDs is transferred as a block to the display substrate, have been developed to address the low throughput of serial pick-place assembly. In the simplest form of mass transfer, a rectangular stamp picks up a rectangular array of microLEDs from a carrier and presses the microLEDs down on the display substrate, where they are bonded to matching electrodes. To make an RGB display the transfer stamp is arranged to pick up only every third microLED to leave space for the other two subpixel colors. For a surface mount microLED as shown in FIG. 2C, the assembly process proceeds sequentially as follows:

1) Separate MOCVD wafers for each color are prepared with the appropriate microLED size and spacing between each microLED. The spacing between adjacent microLEDs is referred to as pitch. See FIG. 3A. Each microLED has a cathode and anode electrode for connection to the display backplane. The microLED array is removed from the growth wafer by laser lift off and held on a carrier substrate (not shown).

2) The display backplane (FIG. 3B) is manufactured with cathode and anode electrodes spaced with some multiple of the microLED pitch on the growth wafer so the position of the electrodes matches the position of the microLEDs on the transfer stamp. This spacing dictates the resolution of the resulting display. Electrodes may be copper, indium tin oxide/aluminum (ITO/Al), or gold, or a solder material like Sn/In. It is also possible that the electrodes are covered with an ACF film. The materials of the microLED and display electrodes are chosen so that an ohmic contact can be formed by the subsequent bonding process in Step 5 below.

3) A stamp is prepared with the position of pickup points matching the display sub-pixel pitch. Several possible pickup mechanisms have been implemented to hold each microLED including elastomers, adhesive tape, electrostatic, and magnetic fields. For clarity FIG. 3C shows a stamp sized for 3×3 pixels, but a practical stamp would assemble many hundreds of pixels.

4) The stamp is positioned in alignment with the carrier substrate holding microLEDs of the first color and the stamp is brought in contact so the holding mechanism can capture microLEDs and remove them from the carrier. See FIG. 3D.

5) The populated stamp is positioned in alignment with the first set of display backplane electrodes as shown in FIG. 3E.

6) The stamp is pressed down to contact the display substrate, typically while heating to form a bond between the microLED electrodes and the display substrate electrodes. After the bond is formed and cooled sufficiently to hold the microLEDs, the stamp is removed for reuse. See FIG. 3F.

7) The same operation is performed for the microLEDs of the second and third colors as shown in FIGS. 3G to 3H, respectively, to form the RGB display array.

This mass transfer assembly method is feasible and displays have been made this way, but there are several significant weaknesses that cause poor yield and high costs. First, the display resolution given by the x and y direction pitches in FIG. 3C can only be integer multiples of the microLED pitch on the MOCVD wafer which is 3×2 in this case. A robust display manufacturing technology must be capable of making industry standard pixel counts like 4K (3,840 by 2,160 pixels) in a variety of screen sizes, so a technique for varying the spacing of microLEDs on the stamp is required (pitch expansion). It is possible to customize the spacing of microLEDs on the MOCVD growth wafer for each display size and resolution, but this increases the cost of each microLED unreasonably. Second, the pickup mechanism must strike a balance between too much and too little connection strength. If the attachment is too weak some microLEDs are not captured from the carrier substrate, leaving a gap in the array. Conversely, if attachment is too strong the microLED can be forcibly removed from the solder bond to the substrate. In both cases the subpixel will be dark, which cannot be tolerated in a display. Finally, the transfer stamp can be complex and difficult to fabricate. The attachment points must be smaller than the microLED pitch so the stamp does not disturb adjacent microLEDs. This can be difficult for the complex holding methods that require the generation of a local field like electrostatic or magnetic attraction. Stamps are also subject to contamination and damage, especially those formed from elastomers like polydimethylsiloxane (PDMS), so effective cleaning of the stamp for reuse is quite important.

To illustrate some of the weaknesses of the mass transfer stamping process, FIG. 3H shows several possible failure modes as follows:
  a) Missing microLED because of poor adhesion to the stamp at pickup;
  b) Misplaced microLED from contamination on stamp;
  c) Particle caused by contamination of the transfer stamp;
  d) Broken microLED;
  e) Shorted microLED caused by a defect in the MOCVD process;
  f) MicroLED pulled out by the stamp causing electrode damage.

FIGS. 4A and 4B depict an exemplary area coverage for stamp pickup with a 14 mm stamp on a 100 mm wafer (FIG. 4A), with 20% of the microLEDs left on the wafer, and three stamps with defective microLEDs (FIG. 4B) (prior art). Another limitation of the simple mass transfer process described above is imposed by the square shape of the stamp, which is incommensurate with the circular wafers used for the MOCVD growth of LEDs. FIG. 4A shows a possible arrangement of 14×14 mm stamp capture regions on a 100 mm wafer, which might be a typical arrangement. Larger stamp area increases assembly speed at the cost of leaving behind more microLEDs on the growth wafer. The requirement that all of the stamp be filled leaves relatively large areas of a wafer which cannot be accessed. In this example the amount of good microLEDs left behind is about 20% of the total, which is a direct addition to costs. In addition, the defective microLEDs must be dealt with either by repair or by discarding the affected stamps. For illustration purposes three random defects are shown. If the defective stamps are discarded in this example, then only about 70% of the original microLEDs are available for display fabrication.

The mass transfer method has one significant strength, which is that the bonding process is carried out with pressure applied to the microLEDs, so that there is good mechanical contact between the two bonding electrodes. This ensures that there are large areas of electrode contact. The mechanical contact can disrupt insulating surface oxides, which improves wetting of the solder material. Pressure is also required for ACF bonding to make hard contact between the conductive filler material and the electrodes on microLEDs and the display substrate.

It would be advantageous if a structure and method could populate a carrier substrate for the mass transfer assembly of microLED displays, improving assembly flexibility and yield in the following ways:
  1) Allowing any arbitrary display resolution by simple pitch expansion;
  2) Making an array of microLEDs with no missing, broken, or shorted device defects (Known Good Die);
  3) Increasing the assembly speed for mass transfer by using a massively parallel method to populate a transfer stamp;
  4) Using a simple transfer stamp that is cheap to manufacture and can be vigorously cleaned for reuse;
  5) Using a stamp holding mechanism that is simple and does not damage the display substrate;
  6) Permitting excess microLEDs to be recycled from defective stamps.

SUMMARY OF THE INVENTION

Disclosed herein are methods and associated structures that use fluidic assembly to prepare an array of micro-light emitting diodes (microLEDs) on a carrier substrate or transfer stamp. The assembled microLEDs can then be applied to a display substrate for bonding by mass transfer methods. The microLEDs are fabricated from conventional metalorganic chemical vapor deposition (MOCVD) wafers with shapes chosen to facilitate fluidic assembly and stamp bonding to a display substrate.

Accordingly, a microLED mass transfer stamping system is presented including a stamp substrate with a top surface. An array of stamp substrate trap sites are formed on the top surface, with each trap site configured with a columnar-shaped recess to temporarily secure a keel extended from the bottom surface of a microLED. In the case of surface mount microLEDs, which have a planar top surface with a first electrode and a second electrode, the keel is electrically nonconductive. In the case of vertical microLEDs, which have a planar top surface with a first electrode, the keel is an electrically conductive second electrode. The stamping system also includes a fluidic assembly carrier substrate with an array of wells formed in the carrier substrate top surface having a pitch separating adjacent wells that matches the pitch separating the stamp substrate trap sites.

An associated microLED mass transfer method provides the fluidic assembly carrier substrate mentioned above, with an array of wells, and also provides the stamp substrate mentioned above, where each trap site in the array is configured with a columnar-shaped recess having the same pitch as the carrier substrate wells. The method uses a fluidic assembly process to fill the carrier substrate wells with microLEDs. The method presses the stamp substrate top surface against the carrier substrate top surface, with each trap site interfacing a corresponding well, and transfers the microLEDs from the carrier substrate to the stamp substrate. Each trap site recess confines a keel extending from a microLED bottom surface, and in response to confining each microLED keel, the microLEDs are secured to the stamp substrate. The use of the carrier substrate eliminates the limitations imposed by the pitch of the microLEDs on the MOCVD wafer, thus permitting the use of a variety of stamp substrate pitches for different display substrate sizes and resolutions.

The method also provides a display substrate with an array of microLED pads, where each microLED pad includes at least one electrode formed in the top surface and electrically connected to an underlying enablement matrix of column and row control lines. The pads have a pitch separating adjacent sites matching the pitch separating the stamp substrate trap sites. The method presses the stamp substrate top surface against the display substrate top surface, with each trap site interfacing a corresponding microLED site, and transfers the microLEDs from the stamp substrate to the display substrate microLED pads. In one aspect, the step of transferring the microLEDs to the display substrate microLED pads includes heating the display substrate to bond the microLEDs to the microLED pads. In the case of a red-green-blue (RGB) display, the method may sequentially press the stamp substrate with traps sites occupied by first wavelength microLEDs, followed by second wavelength microLEDs, followed by third wavelength microLEDs. Alternatively, a separate stamp substrate is dedicated to each microLED wavelength.

Also presented is a microLED mass transfer method using a fluidic assembly stamp substrate having a planar top surface, with trap sites formed in the top surface having a first perimeter shape, a depth, and a planar trap site bottom surface. Using a fluidic assembly process, the trap sites are filled with microLEDs having the first perimeter shape, a thickness greater than the trap site depth, a planar bottom surface interfaced to the trap site bottom surface, a planar top surface extending out of the trap site with a first electrode, and a securing mechanism. In one aspect the securing mechanism is a keel formed on the microLED top surface, which may be either an electrically conductive keel connected to the first electrode of the microLED or a temporary, electrically nonconductive keel that is removed after the microLEDs are situated in the stamp substrate. Alternatively, the securing mechanism is a first component of a conjugated bio molecule pair coating each microLED bottom surface. In this aspect, a second component of the conjugated bio molecule pair coats each trap site bottom surface.

As above, the method provides a display substrate having a planar top surface and an array of microLED pads, with each microLED pad including a first electrode formed in the top surface that is electrically connected to an underlying enablement matrix of column and row control lines. The display substrate has a pitch separating adjacent sites matching the pitch separating the stamp substrate trap sites. The method presses the stamp substrate top surface against the display substrate top surface, with each trap site interfacing a corresponding microLED site, and transfers the microLEDs from the stamp substrate to the display substrate microLED pads. Again, heating may be applied to the display substrate during the transfer to promote electrode bonding.

Also presented is a method for the mass transfer of axial lead microLEDs. The method provides a fluidic assembly stamp substrate with a planar top surface, with trap sites formed in the top surface having a first perimeter shape, a center section with a planar first depth, a distal end with a planar second depth less than the first depth, and a proximal end with the planar second depth. Using a fluidic assembly process, the method fills the trap sites with axial microLEDs, each occupying a corresponding trap site and having the first perimeter shape, a body interfaced with the trap site center section, having a vertical plane body thickness greater than the trap site first depth but less than 2× the trap site first depth. A distal electrode horizontally bisects the body and interfaces with the trap site distal end, with a vertical plane electrode thickness greater than the trap site second depth but less than 2× the trap site second depth. A proximal electrode, with the (same) electrode thickness, horizontally bisects the body and interfaces with the trap site proximal end.

The method provides a display substrate having a planar top surface and an array of microLED pads, each microLED pad including a pair of electrodes formed in the top surface and electrically connected to an underlying enablement matrix of column and row control lines. The display substrate has a pitch separating adjacent sites matching the pitch separating the stamp substrate trap sites. The method presses the stamp substrate top surface against the display substrate top surface, with each trap site interfacing a corresponding microLED site, and transfers the microLEDs from the stamp substrate to the display substrate microLED pads, typically with the addition of heat to promote electrode bonding.

Addition details of the above-described systems and methods are provided below.

DETAILED DESCRIPTION

The general process for making a microLED display using inorganic LEDs and fluidic assembly on a display backplane has been reported in U.S. Pat. Nos. 9,825,202 and 10,418,527, which are incorporated herein by reference. In particular, the process flow for making a suitable display backplane is described in U.S. Pat. No. 9,825,202 starting at Col. 13 ln. 26, and shown in FIG. 17. The electrical requirements are described in pending application Ser. No. 16/727,186, which is also incorporated herein by reference. The display substrate used herein has the same row and column arrangement and thin-film transistor (TFT) circuits as previously described in U.S. Pat. No. 9,825,202 in FIGS. 14B and 14C, but there is no well layer because the mass transfer stamp sets the location of the microLED.

Figure 1A:
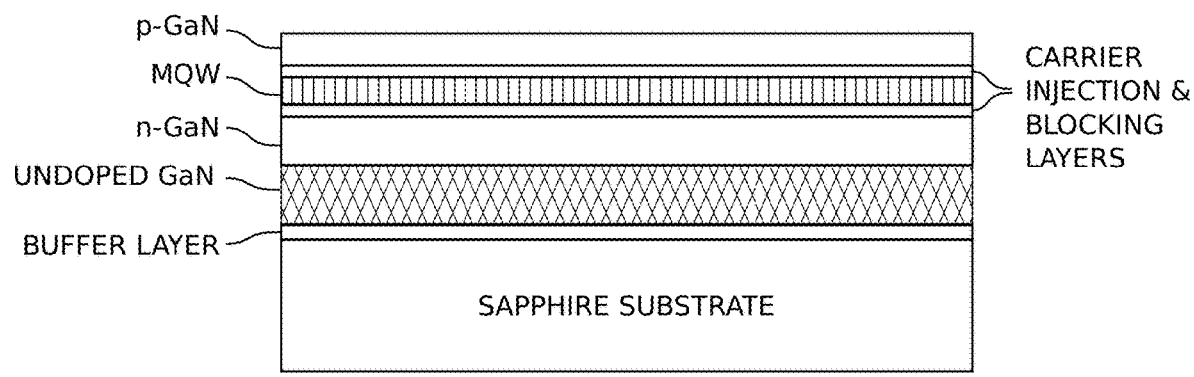
FIGS. 1A through 1C depict a cross-sectional view of a GaN based LED stack (FIG. 1A), cross-sectional views of two fully processed vertical microLEDs (FIG. 1B) and a surface mount microLED (FIG. 1C) (prior art).
Figure 1B:
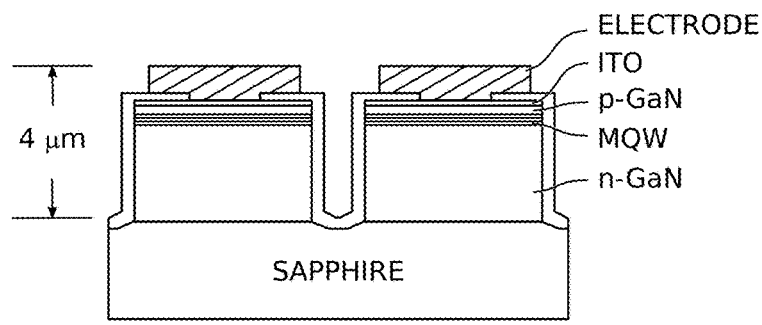
Figure 5:
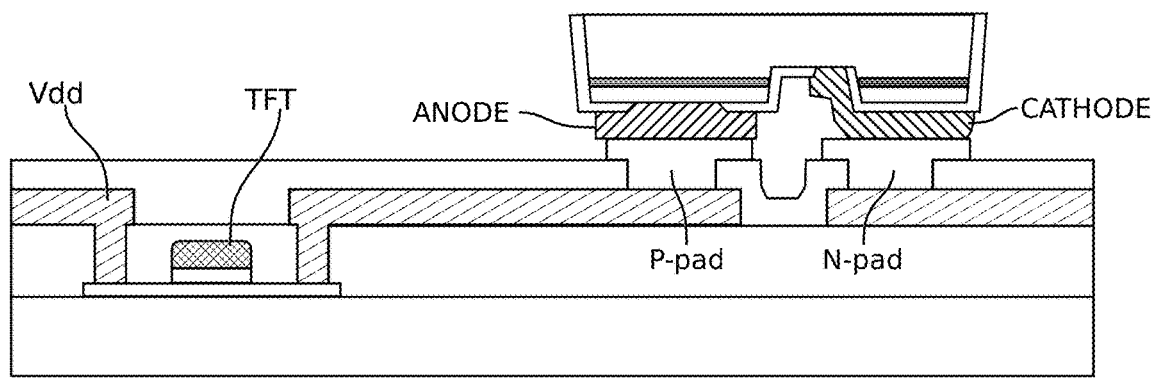
FIG. 5 is a partial cross-sectional view of an exemplary backplane arrangement showing one surface mount microLED and the power transistor which controls the brightness of the microLED.

FIG. 5 is a partial cross-sectional view of an exemplary backplane arrangement showing one surface mount microLED and the power transistor which controls the brightness of the microLED.

The fluidic assembly techniques presented previously in U.S. Pat. Nos. 9,825,202, 10,418,527, and 10,543,486 (incorporated herein by reference) are suitable for the low cost manufacture of microLED displays by direct stochastic assembly. The same assembly techniques are used herein to prepare a stamp which is in turn used to bond the microLEDs to the electrodes on the display substrate. The advantage of this approach, as compared to the direct fluidic assembly strategies, is that the use of a stamp aids the formation of ohmic contacts between the microLED and the display by applying pressure during bonding. As used herein, a transfer stamp is prepared with capture structures arranged in an array with spacing between trap sites matching the display pixel pitch. The stamp can be made of glass, quartz, or single-crystal silicon, and the trapping site structures (also described as wells) can be formed by etching into the stamp or by applying a film such as a photo patternable polyimide to the stamp, and patterning the wells using photolithography. The trap sites have the same shape as the microLED and may be slightly larger as described in U.S. Pat. No. 10,804,426 FIG. 8, which is incorporated herein by reference. Unique to the systems described herein is that the depth of the trapping site may be less than at least one point of the microLED thickness, so the microLED can contact the assembly tool or the display substrate without interference from the stamp top surface. Wells (trap sites) etched into the stamp are more robust and can be cleaned more vigorously, but the control of trap site depth is more difficult. Conversely, trap sites formed in polyimide or a deposited film have a depth controlled precisely by the thickness of the film, but are more susceptible to damage.

Figure 4A:
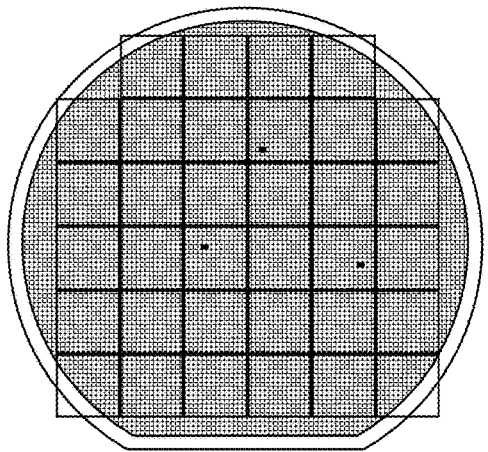
FIGS. 4A and 4B depict an exemplary area coverage for stamp pickup with a 14 mm stamp on a 100 mm wafer (FIG. 4A), with 20% of the microLEDs left on the wafer, and three stamps with defective microLEDs (FIG. 4B) (prior art).
Figure 4B:
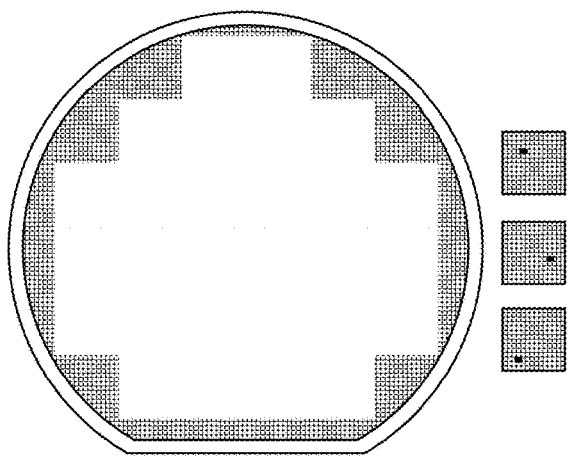
Figure 1C:
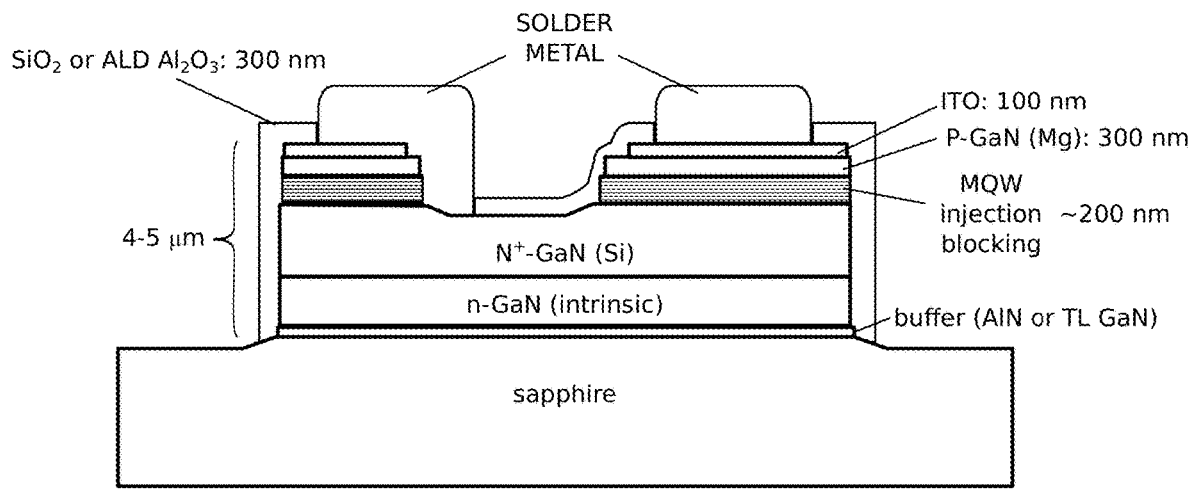
Figure 1C:
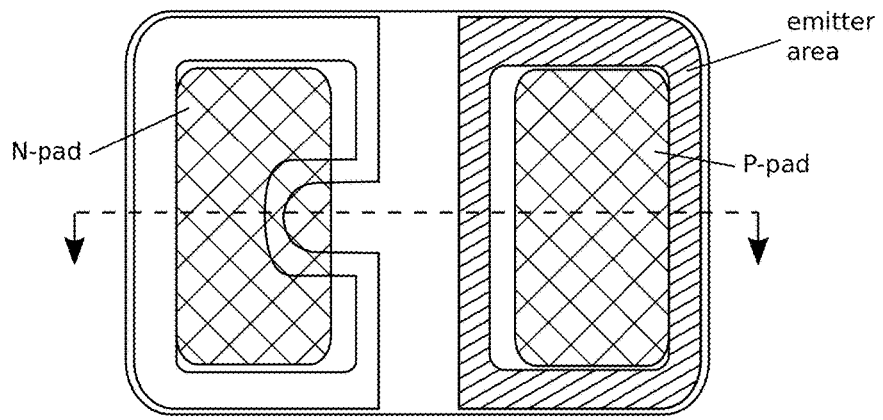
Figure 2A:
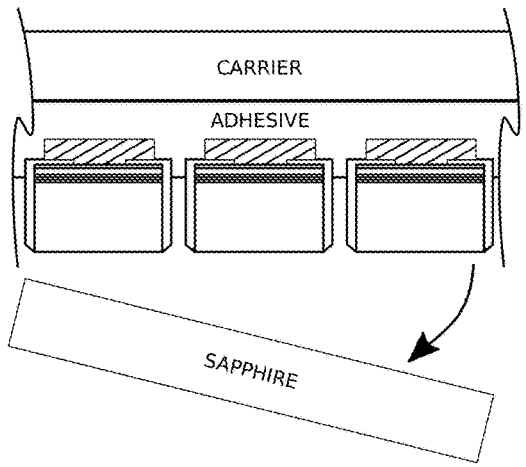
FIG. 2A depicts microLEDs removed from the sapphire growth substrate using laser lift off (LLO).
Figure 2B:
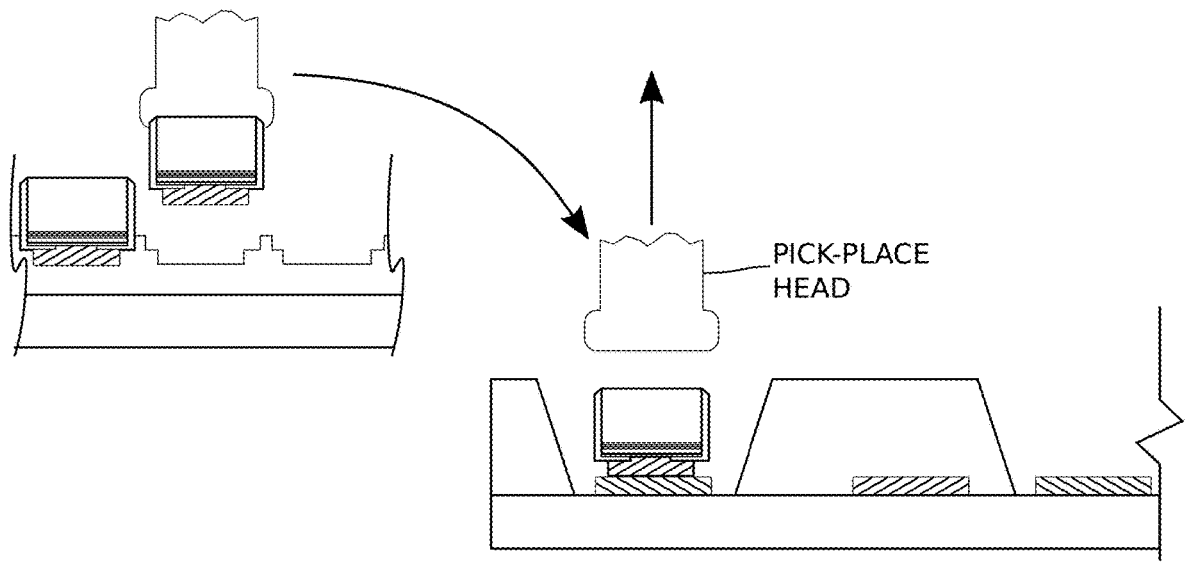
FIG. 2B depicts a pick-and-place process moving devices from the carrier wafer and positioning them on a display substrate.
Figure 2C:
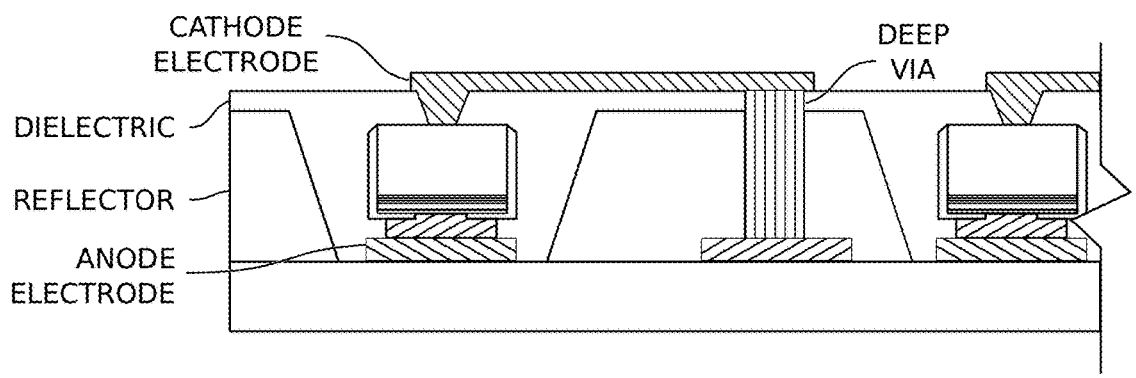
FIG. 2C depicts the connection of the microLED anode to a substrate electrode (FIG. 2C) (prior art).
Figure 3A:
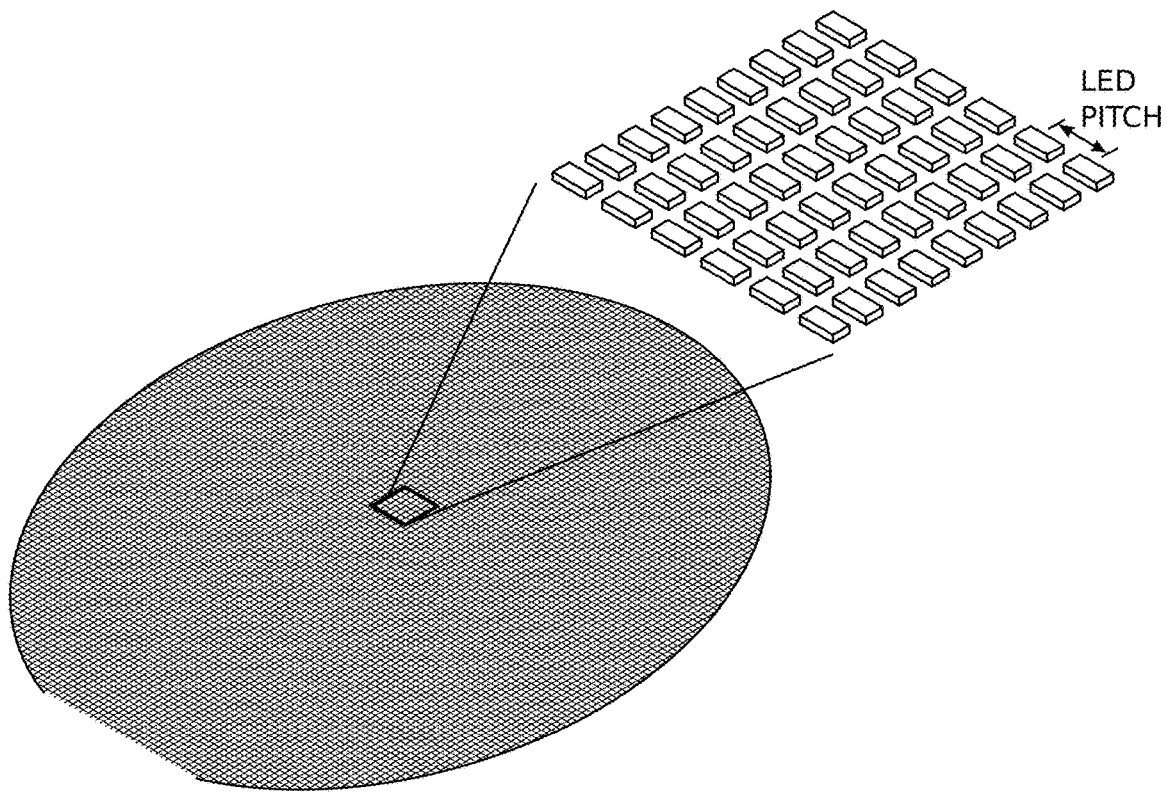
FIGS. 3A to 3H depict steps in an exemplary mass transfer process (prior art).
Figure 3B:
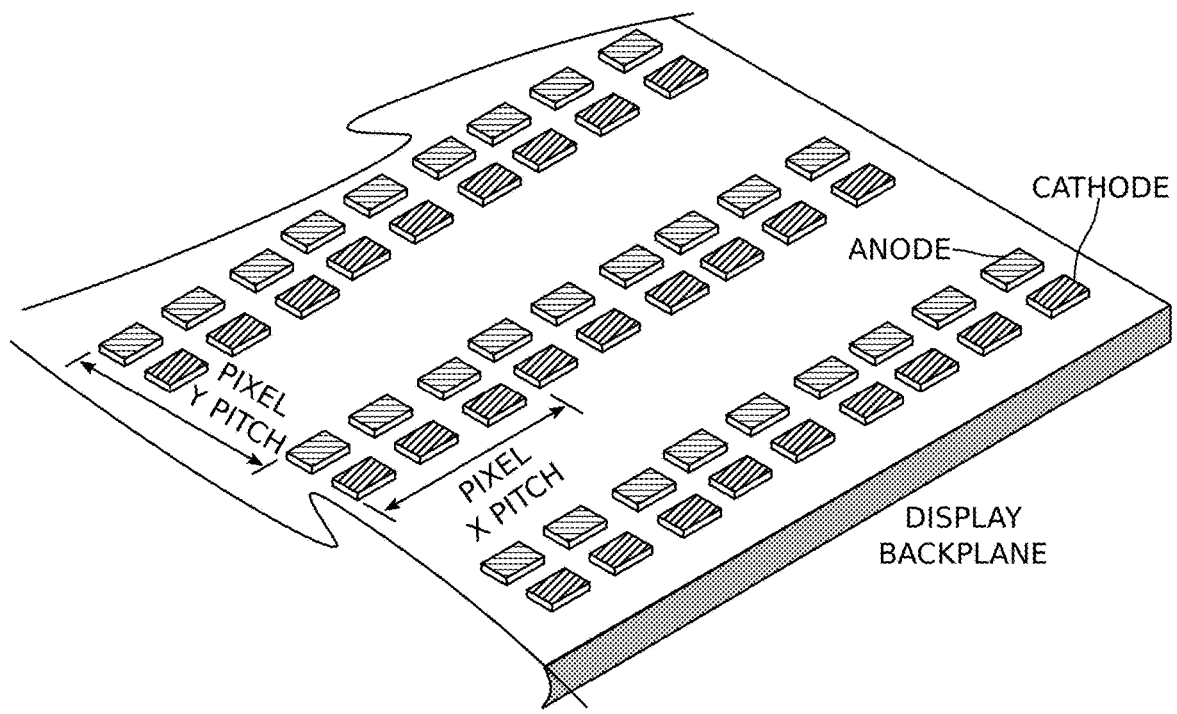
Figure 3C:
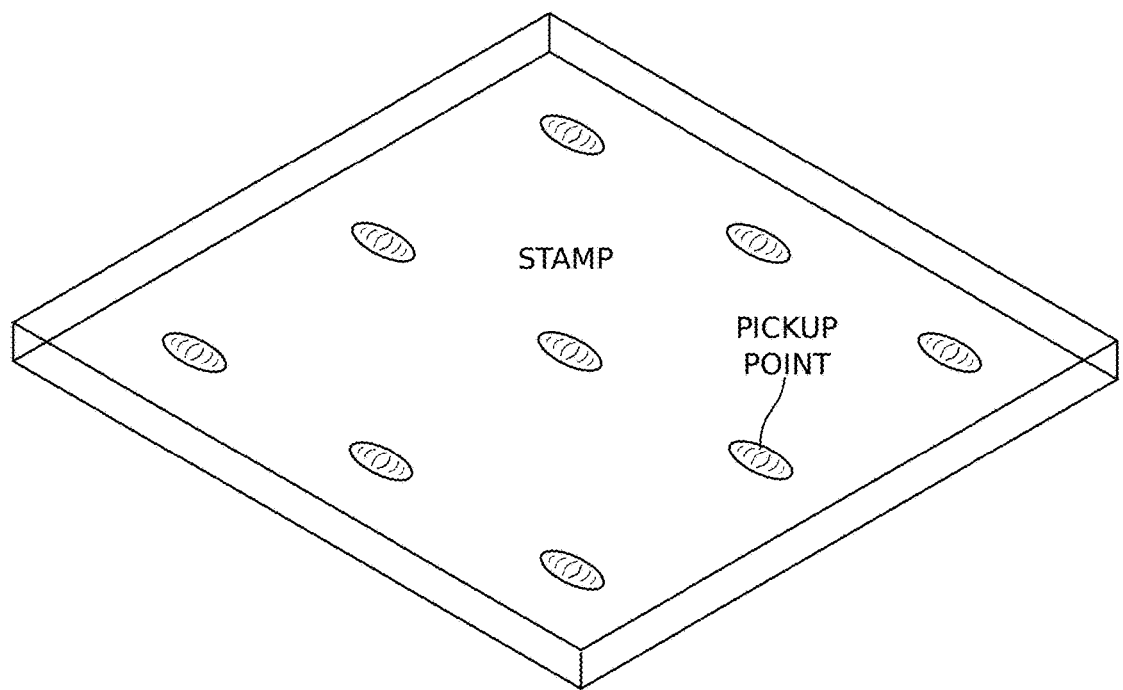
Figure 3D:
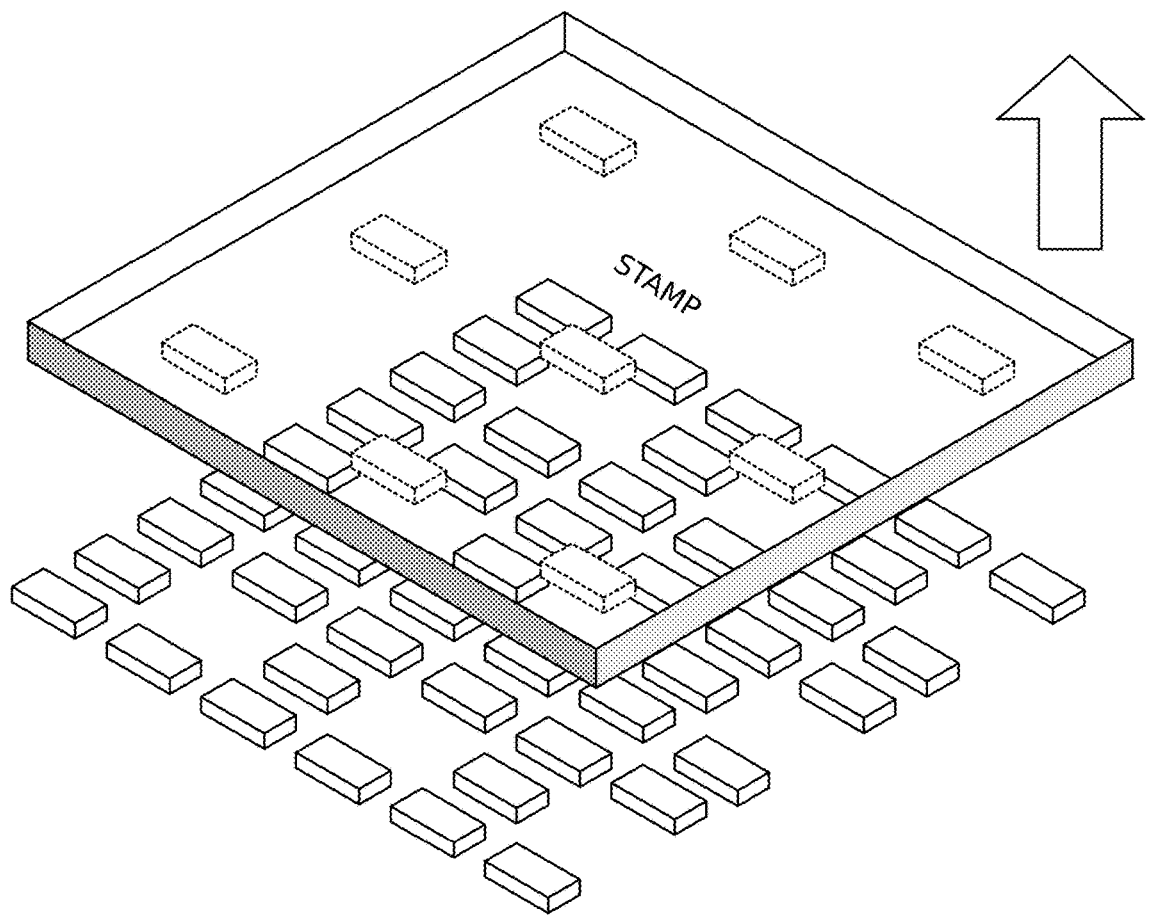
Figure 3E:
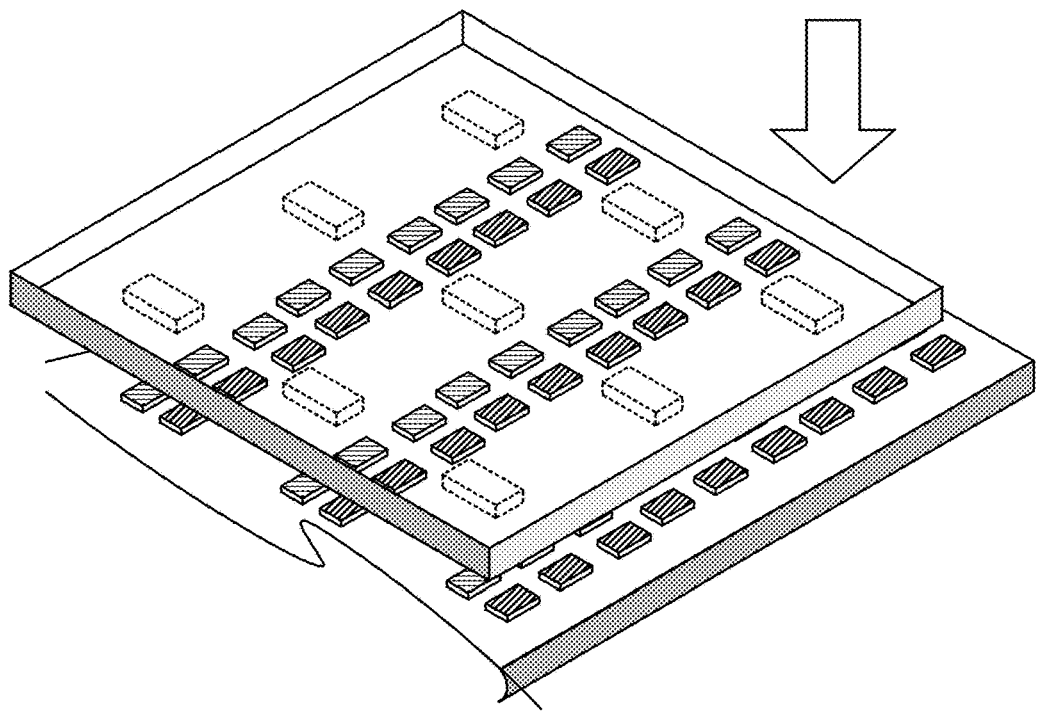
Figure 3F:
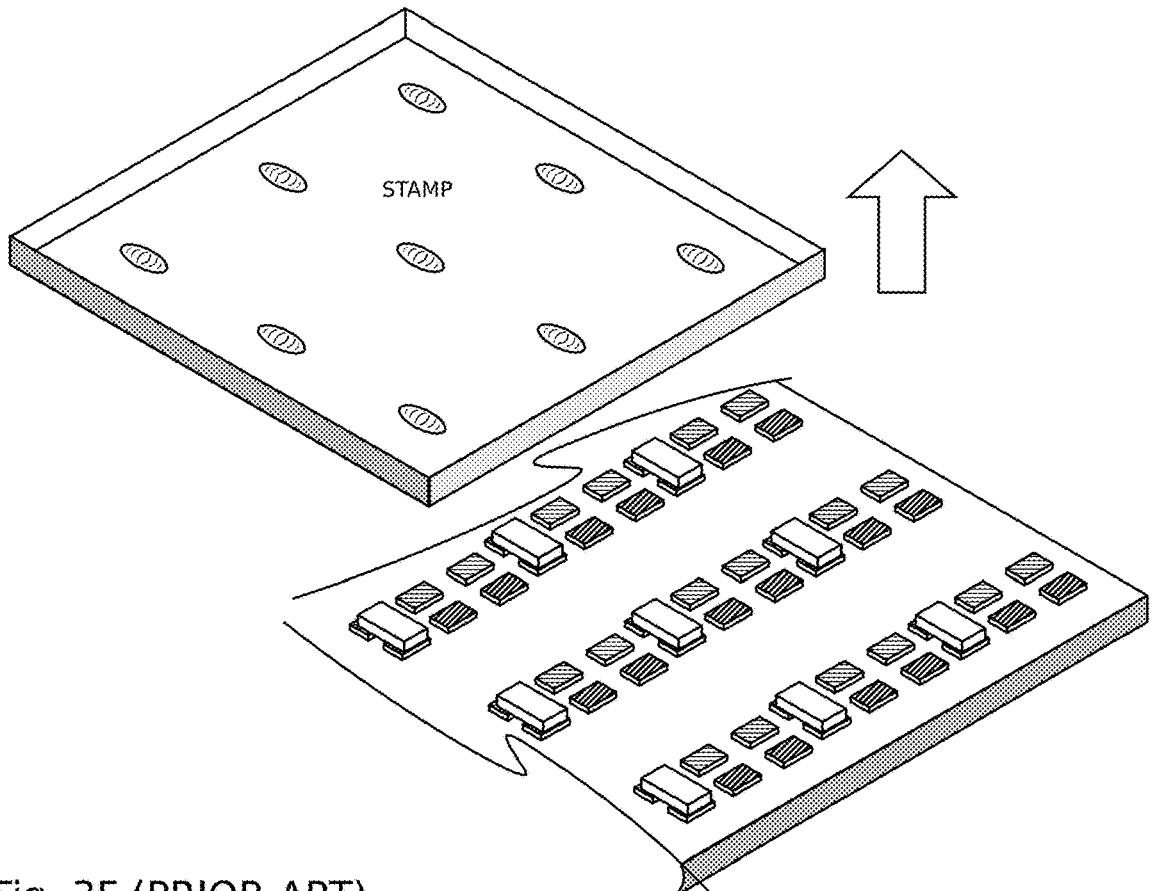
Figure 3G:
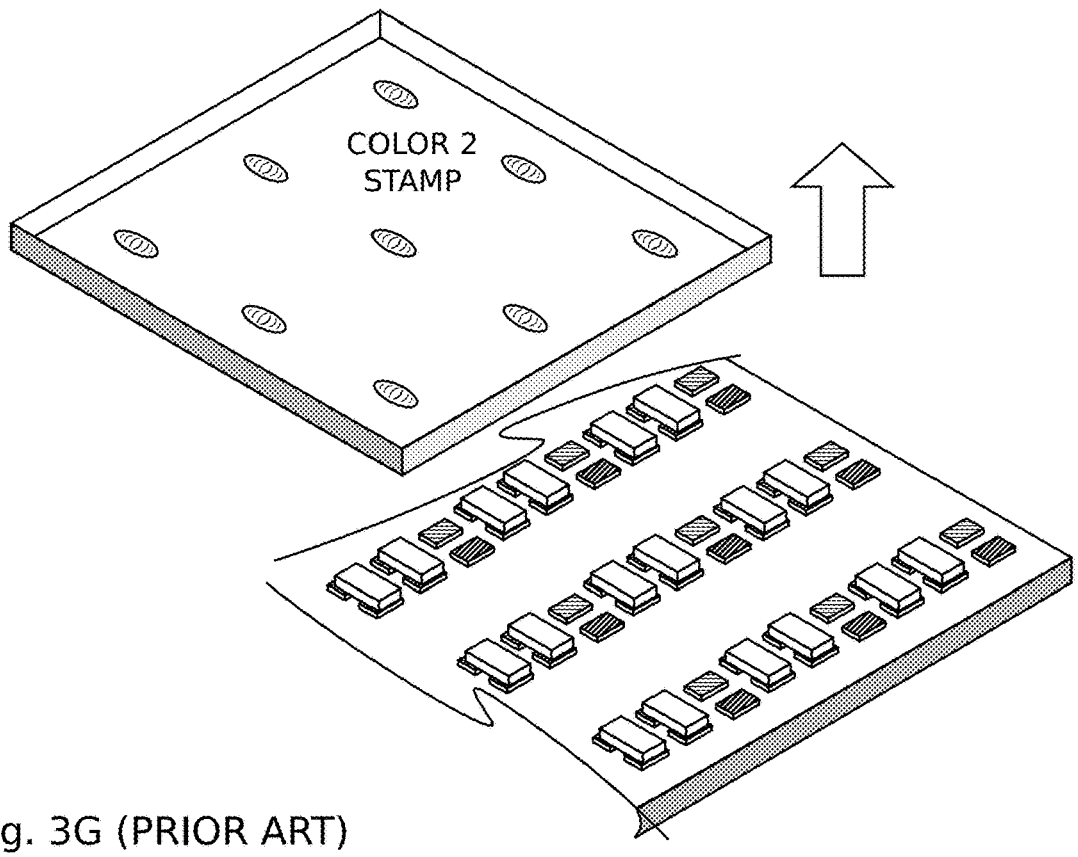
Figure 3H:
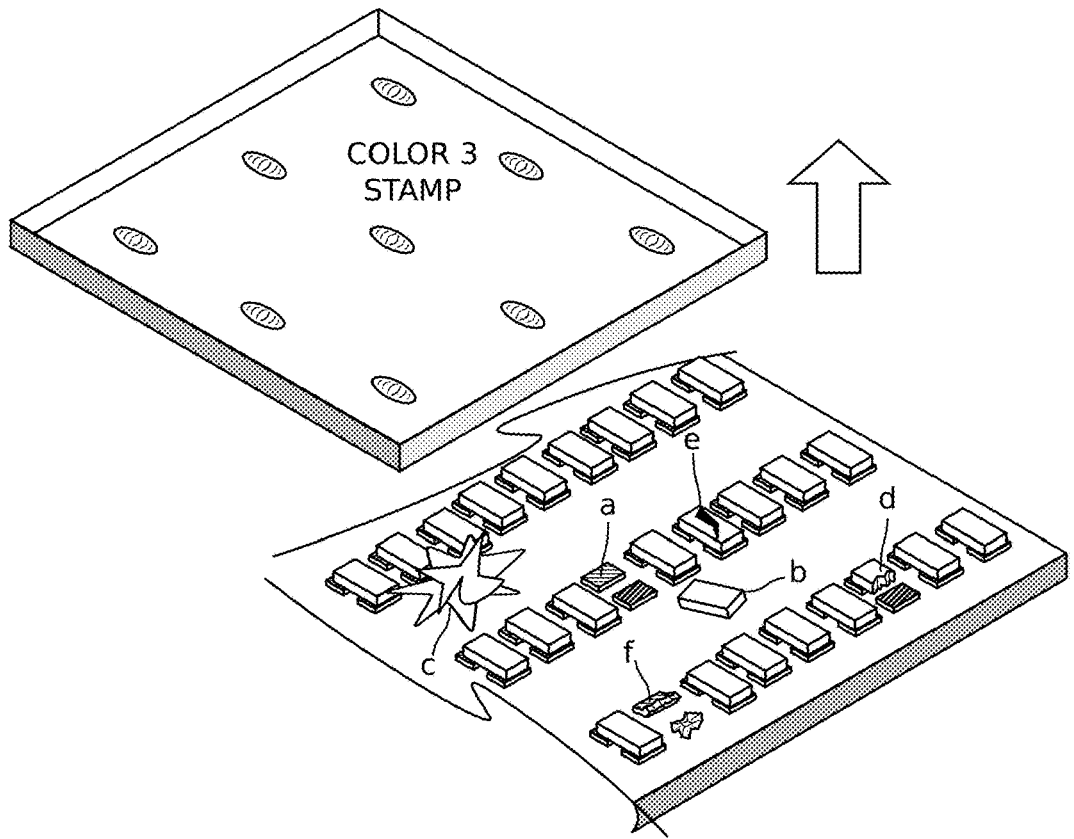

The stamping system described herein is compatible with a variety of microLED configurations, but the conventional LED structure shown in FIG. 2C does not work because it lacks a means of orienting the device during fluidic assembly so that electrodes are positioned correctly for bonding to the display substrate. The round disk shaped surface mount microLEDs described in U.S. Pat. No. 10,804,426 are designed to produce a range of solutions within the constraints on fluidic assembly described in U.S. Pat. No. 9,825,202 starting at Col. 12 ln. 56 and shown in FIG. 16, so these devices are used to illustrate the stamping systems described herein. It should be clear that other microLED shapes such as the square, rectangular, and triangular devices, as shown in U.S. Pat. No. 9,825,202 FIG. 8 and U.S. Pat. No. 10,516,084 FIG. 4 (incorporated herein by reference), can be used in the same way. Similarly, the stamping system is not limited to surface mount microLEDs. Vertical devices can also be assembled by this method using a single bottom electrode, and after assembly, processing to fabricate the top electrode. Those variants should be obvious to one skilled in the art and they are not described in detail in the interest of brevity.

Figure 6A:
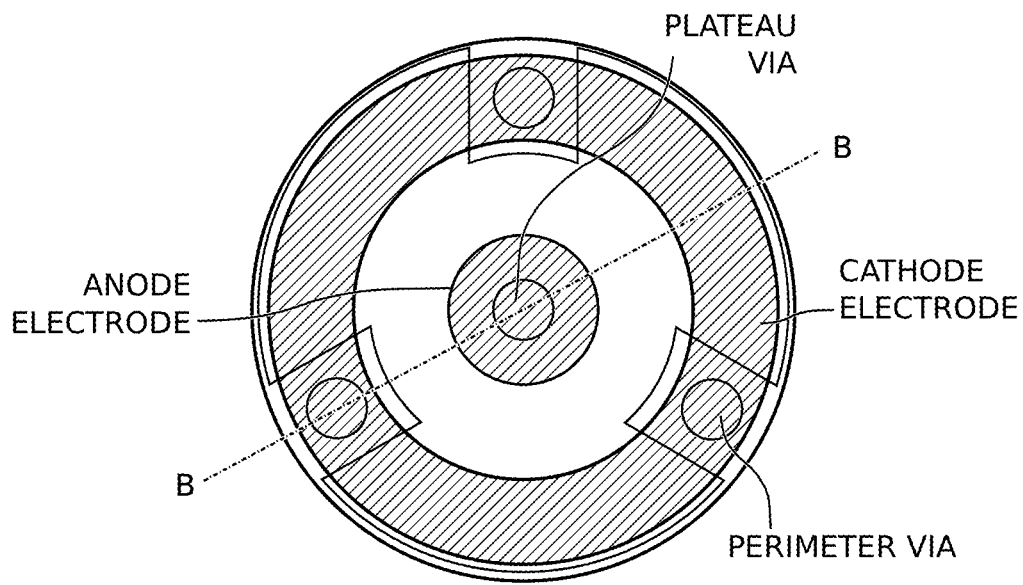
FIGS. 6A and 6B are, respectively, plan top down and cross-sectional views of a surface mount microLED for fluidic assembly.
Figure 6B:
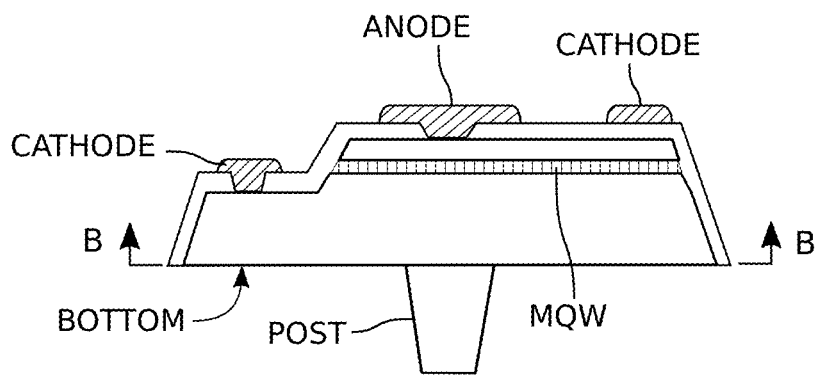

FIGS. 6A and 6B are, respectively, plan top down and cross-sectional views of a surface mount microLED for fluidic assembly. The device structure is typically 20 to 100 microns (μm) in diameter and 4 to 6 μm thick with a post (keel) that is 5 to 10 (μm) tall. In this case the wells may be about 3.5 to 4.5 μm deep to accommodate the microLED thickness. Details of the fabrication process flow are found at Col. 8 ln. 56 and FIG. 6 of U.S. Ser. No. 10/804,426. The round disk shape is matched to a cylindrical trap site with a depth that is typically less than the thickness of the LED and a diameter slightly greater than the diameter of the microLED. The surface mount electrodes are fabricated of a solder material, such as Sn/In or Au/Ge, and the bonding surface of the P-pad and N-pad electrodes must be in the same plane to facilitate bonding.

Figure 7:
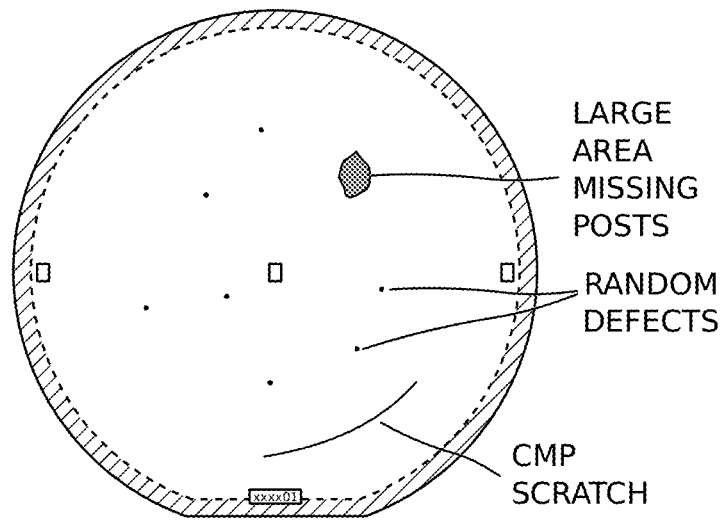
FIG. 7 depicts a microLED wafer after selective harvest.

FIG. 7 depicts a microLED wafer after selective harvest. Inspections to identify defects are carried out using optical microscopy, scanning electron microscope (SEM) images, cathodoluminescence, and/or photoluminescence. The objective is to identify all of the defects that can cause faulty display pixels, so they can be eliminated from the microLED suspension used for manufacturing. Combining the defect maps with known patterns like edge bead and alignment structures yields the locations of all known defective microLEDs. Using a printing process those defects are covered with a capture material that prevents their harvest. As shown, the selective harvest captures all of the good microLEDs that a stamp process would leave behind, while leaving behind the defective devices. The combination of high utilization and preventing the inclusion of defective devices is a significant advantage of the fluidic assembly technology. The methods of selective harvest are described more completely in pending application Ser. No. 16,875, 994, which is incorporated herein by reference.

After microLED fabrication is completed, the growth wafer is attached to a carrier wafer with an adhesive layer, the microLEDs are released from the sapphire growth wafer by a laser lift-off (LLO) process, and the orientation keels are patterned on the bottom surface of the microLEDs.

The microLED suspension is dispersed on the carrier substrate and assembly proceeds as described in U.S. Pat. No. 10,418,527 and 10,804,426 FIG. 7. For use with mass transfer it is very important that there are no surface contaminants to interfere with the contact between the exposed surfaces of the microLEDs and the target surface. Thus, any non-assembled excess microLEDs on the surface are removed and recycled after assembly so effective clean-off methods are quite important.

Figure 8:
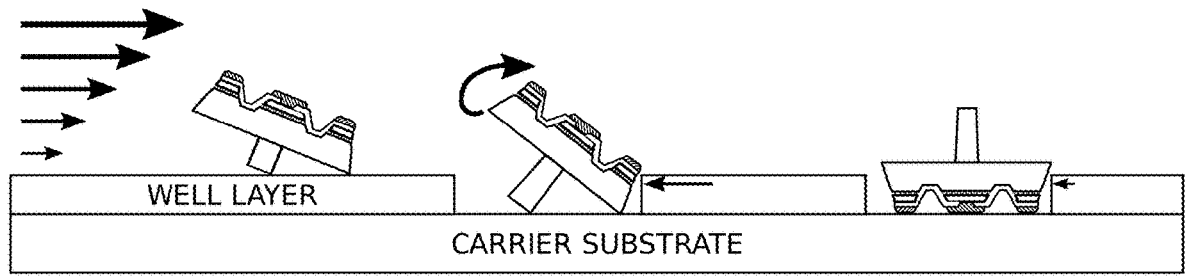
FIG. 8 depicts a very brief synopsis of the fluidic effects that enable assembly of 100% of the microLEDs correctly oriented with electrodes down.

FIG. 8 depicts a very brief synopsis of the fluidic effects that enable assembly of 100% of the microLEDs correctly oriented with electrodes down. The assembled carrier is inspected and if some well sites are not populated, or if there is another defect like excess unassembled microLEDs, the stamp is simply rinsed with solvent to remove the microLEDs, and the solvent is captured in a reservoir to recycle the microLEDs. The empty stamp is cleaned further, dried, and inspected to ensure that there is no surface contamination or residue remaining in the trap sites. This capability is an important improvement over conventional stamps, which use elastomers or adhesives to hold microLEDs, that are difficult to clean and reuse. With the conventional technology the stamps with contamination or missing microLEDs are typically discarded so the good microLEDs on the stamp cannot be recycled.

FIGS. 9A through 9D depict steps in the use of a microLED mass transfer stamping system. The system comprises a stamp substrate 900 with a top surface 902. An array of stamp substrate trap sites 904 is formed on the top surface 902. Each trap site 904 is configured as a columnar-shaped recess to temporarily secure a keel 906 extended from a bottom surface 908 of a microLED 910. As shown, the microLEDs 910 are surface mount microLEDs, each having a planar top surface 912 with a first electrode 914 and a second electrode 916. In this case the keel 906 is electrically nonconductive. In this particular example, the second electrode is a ring or partial ring surrounding the first electrode (see FIG. 6A). With regard to either the systems of FIGS. 9A-9D or FIGS. 11A-11D (presented below), the stamp substrate top surface 902 may be patterned with an adhesive or an elastomer to promote the attachment of a microLED to a trap site.

Figure 9A:
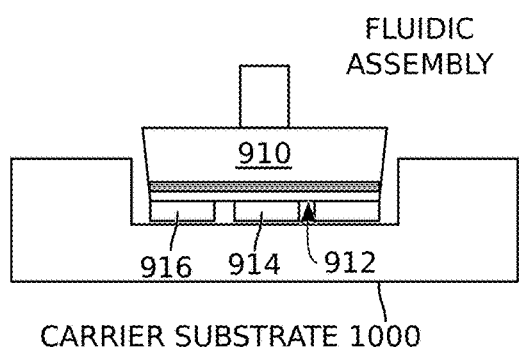
FIGS. 9A through 9D depict steps in the use of a microLED mass transfer stamping system.
Figure 9B:
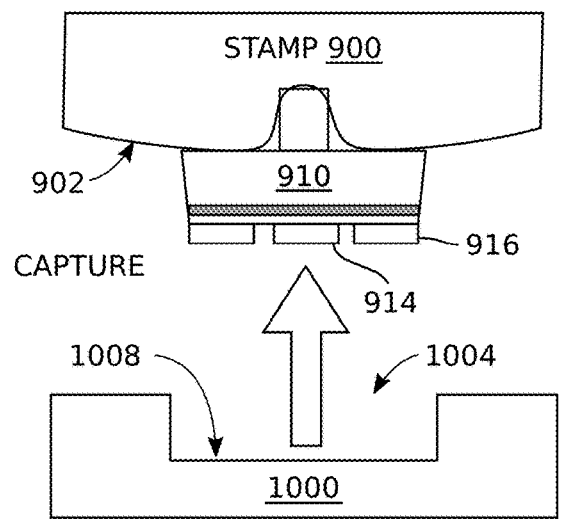
Figure 9C:
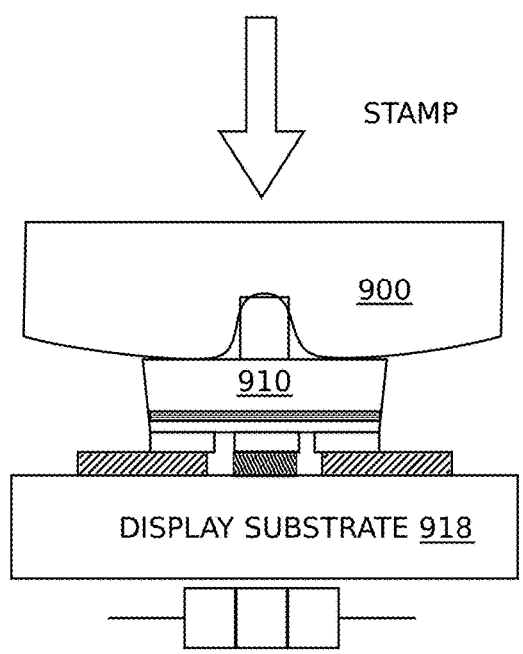
Figure 9D:
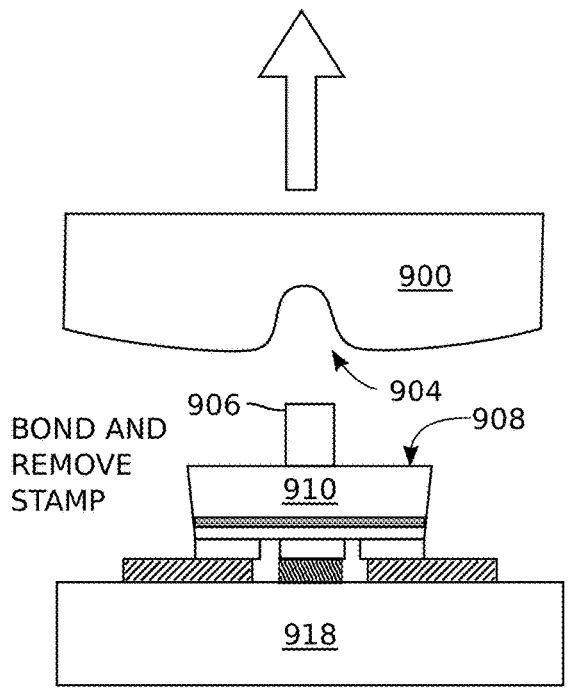

The populated carrier substrate 1000 is a source for the mass transfer to the display substrate 918 using the stamp substrate 900, shown for a single microLED in the figures for the purpose of illustration. Although not explicitly shown in this figure, the electrode pads of the display substrate are connected to a network of row and column lines that enable the microLED, as explained in greater detail in U.S. Pat. No. 9,825,202. In this case the carrier 1000 is a planar surfaced substrate with recessed wells that allow the localized protrusions surrounding the recesses 904 on the stamping head (optionally coated with an adhesive or elastomer) to contact each microLED (FIG. 9B). Because the microLEDs are typically held in the carrier only by gravity, the relatively weak attachment allows the microLED to be removed from the carrier with the optional use of an adhesive or elastomer during transfer. The stamp is aligned with the display electrodes and pressed down to make hard contact between the microLED electrodes and the display electrodes while heat is applied to form the solder bond (FIG. 9C). In an alternate embodiment, contact is made by an intervening ACF film (not shown). When the bonding is complete the transfer stamp is withdrawn leaving the microLEDs (FIG. 9D). The transfer head 900 and the carrier plate 1000 are cleaned for reuse and the cycle is repeated to populate the full area of the display 918.

FIGS. 10A through 10D are cross-sectional views depicting the process of transferring microLEDs from a carrier substrate to the display substrate. The system includes fluidic assembly carrier substrates 1000a-1000c comprising a planar top surface 1002 and an array of wells 1004 formed in the carrier substrate top surface having a pitch 1006 separating adjacent wells that matches the pitch separating the stamp substrate trap sites. The carrier substrate wells 1004 have a first perimeter shape (in this example, circular) and a planar well bottom surface 1008. The surface mount microLEDs 910a-910c each have the first perimeter shape, and a planar top surface 912, interfacing a corresponding well bottom surface 1008, with a first electrode 914 and a second electrode 916 (see FIG. 9A).

Figure 10A:
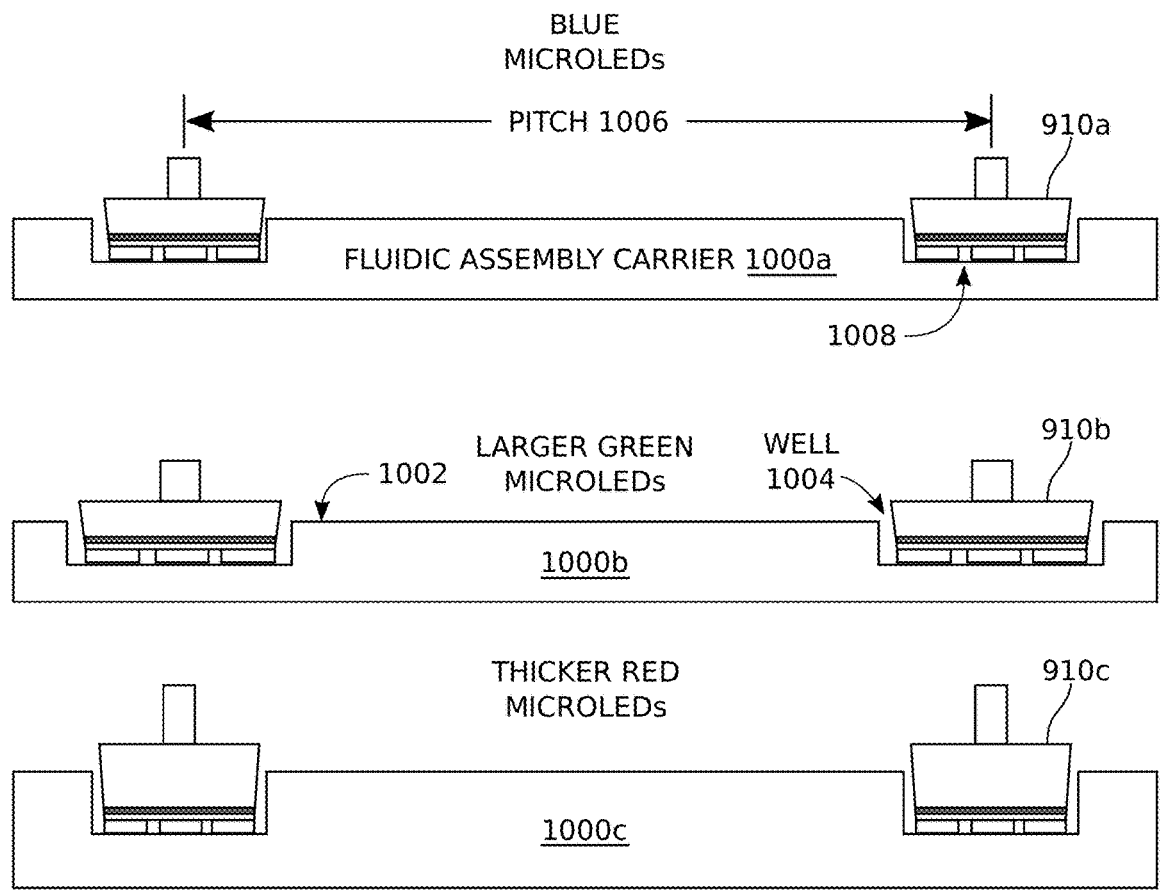
FIGS. 10A through 10D are cross-sectional views depicting the process of transferring microLEDs from a carrier substrate to the display substrate.
Figure 10B:
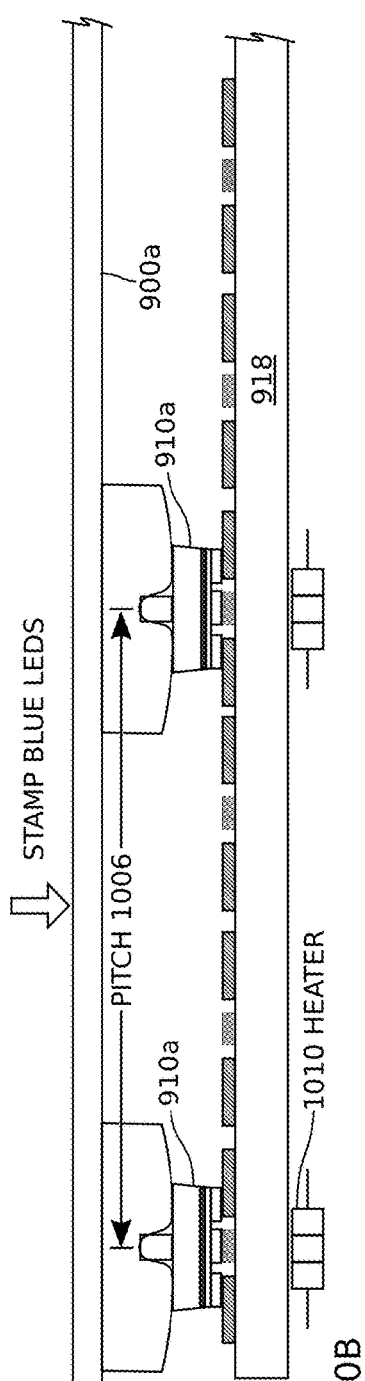

In the case of an RGB display, the stamping system may further comprise a first fluidic assembly carrier substrate 1000a with an array of wells formed in the carrier substrate top surface having a pitch 1006 separating adjacent wells matching the pitch separating the stamp substrate trap sites (FIG. 10B). MicroLEDs 910a configured to emit light in a first wavelength each occupy a corresponding well in the first carrier substrate 1000a. Likewise, a second fluidic assembly carrier substrate 1000b has an array of wells formed in the carrier substrate top surface with a pitch 1006 separating adjacent wells that matches the pitch separating the stamp substrate trap sites. MicroLEDs 910b are configured to emit light in a second wavelength, with each occupying a corresponding well in the second carrier substrate 1000b. A third fluidic assembly carrier substrate 1000c has an array of wells formed in the carrier substrate top surface with a pitch 1006 separating adjacent wells that matches the pitch separating the stamp substrate trap sites. MicroLEDs 910c are configured to emit light in a third wavelength, with each occupying a corresponding well in the third carrier substrate 1000c.

Figure 10C:
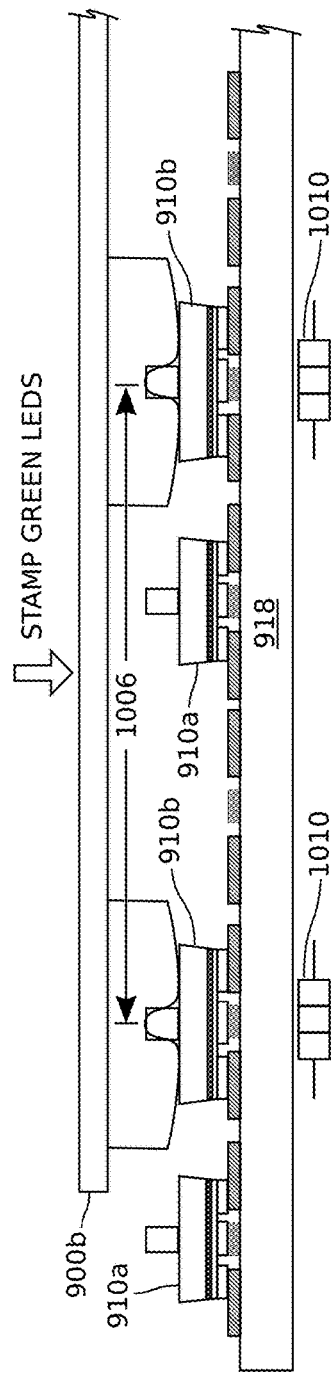
Figure 10D:
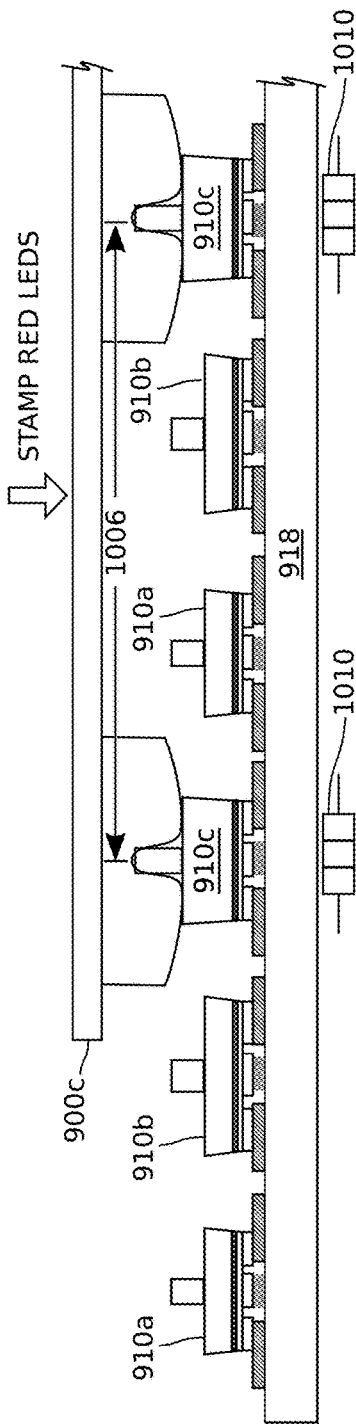

To fabricate the three colors required for an RGB display the assembly and stamping operations are carried out three times sequentially with the three color microLEDs as shown in FIGS. 10A-10D. Three carrier substrates are prepared with an array of trap sites separated by the display pixel pitch distance 1006. It is quite possible that differences in process flow or LED performance for the three different colors of microLED dictate that each color microLED is a different size and/or shape. For example, red microLEDs can be fabricated from aluminum indium gallium phosphorus (AlInGaP) as described in U.S. Pat. No. 10,804,426, in which case the red microLED can be thicker than the GaN based blue and green devices. Because blue and green microLEDs have different quantum efficiencies, while the sensitivity of the human vision system is much higher for green colors, it may be desirable to make blue and green microLEDs with different emission areas. An example of these differences is shown as FIG. 10A where each carrier is tuned to meet the requirements of a corresponding color microLED. The stamp substrate captures the array of blue microLEDs 910a from the carrier plate and moves to the display substrate 918 where it aligns the stamp with an unpopulated area of the display and brings the microLED electrodes into physical contact with the matching electrodes on the display substrate (FIG. 10B). Pressure and heat 1010 are applied to force the electrodes into intimate contact and melt the metals to form a solder bond. In FIG. 10C and 10D the green 910b and red 910c microLEDs are transferred and bonded in the same way. The bonding between the microLEDs and pads may include the use of materials such Au/Ge to Cu, In/Sn to Cu, and Au/ACF/Cu. If using ACF, a wide range of display electrode materials are possible, such as Mo/Al/Mo.

In this aspect the use of fluidic assembly produces several improvements over the simple stamping process of the prior art:
1) There are no gaps in the array pattern due to defects or missing microLEDs;
2) Selective harvest and fluidic assembly fully utilize all the good microLEDs on a wafer;
3) Recycling of microLEDs from assembly and defective carriers prevents waste;
4) Carrier substrates are made with trap sites at the display pitch, which simply accomplishes pitch expansion.

FIGS. 11A through 11D depict a stamping system where the microLEDs are vertical microLEDs. Each vertical microLED 1100 has a planar top surface 1102 with a first electrode 1104, and a keel 906 that is an electrically conductive second electrode. As with the surface mount microLEDs, the carrier substrate wells 1004 have a first perimeter shape (e.g., circular) and a planar well bottom surface 1008. The vertical microLEDs 1100 each have the first perimeter shape and a planar top surface 1102 interfacing a corresponding well bottom surface 1008, with a first electrode 1104.

For smaller microLEDs, where there may not be enough area to fabricate the two electrodes on the same surface as with the surface mount microLED, the same assembly process can be used for vertical microLEDs. In this case the microLED is fabricated with a single cathode electrode on the top surface and the anode electrode is a conductive post (keel) fabricated from electroplated gold or copper on the bottom surface. The conductive post also serves as the alignment keel for fluidic assembly in the carrier plate (substrate).

Figure 11A:
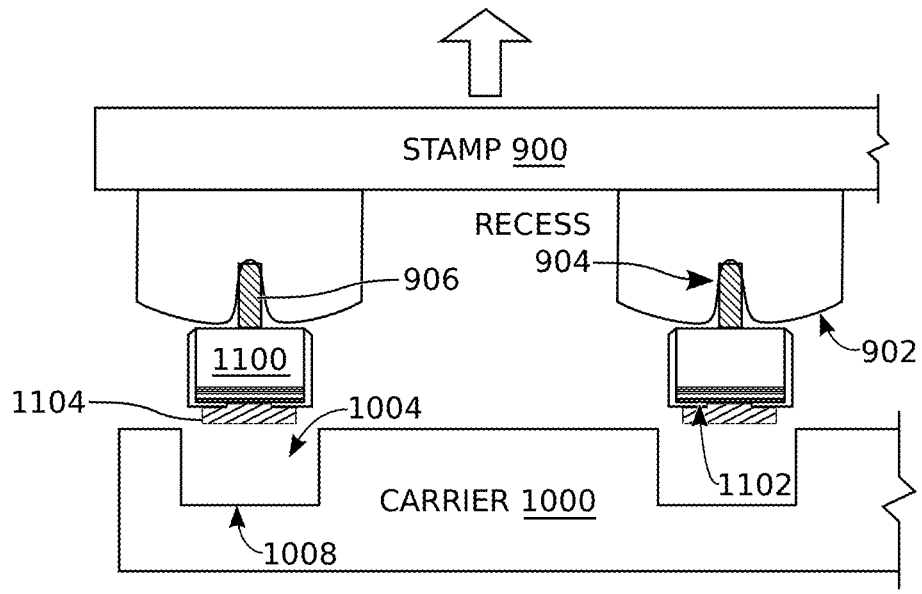
FIGS. 11A through 11D depict a stamping system where the microLEDs are vertical microLEDs.
Figure 11B:
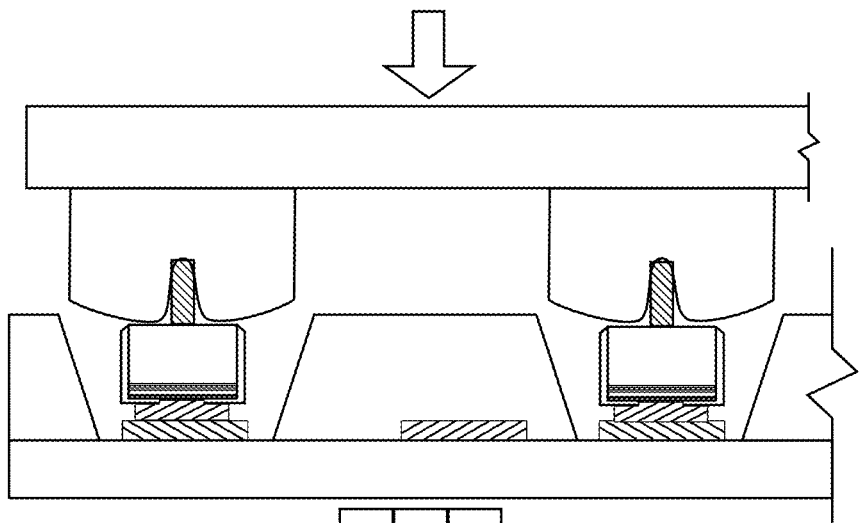
Figure 11C:
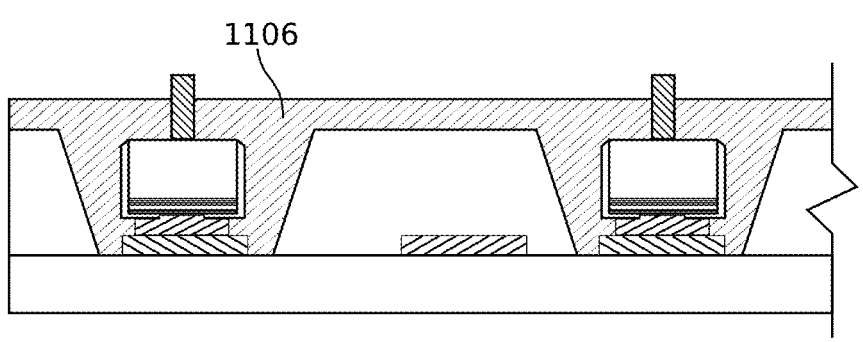
Figure 11D:
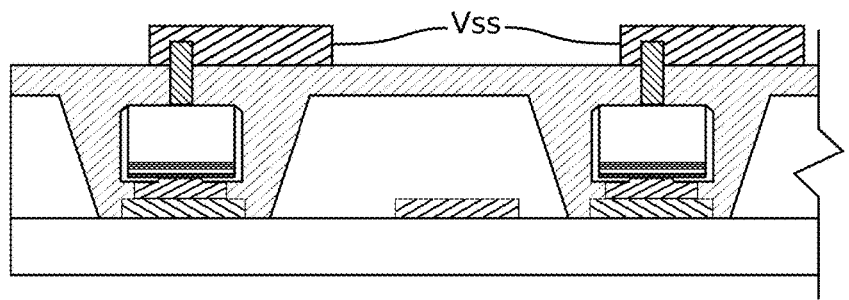

The assembly and bonding sequence for the conductive keel vertical microLED is shown. A suspension of microLEDs is prepared by selective harvest as described above and dispensed on the surface of a carrier substrate prepared with wells on the display pitch and the assembly proceeds routinely. A stamp is aligned with the carrier plate and the microLEDs are captured and removed from the carrier as shown in FIG. 11A. The populated stamp is aligned with the display substrate and pressed against the surface forcing mechanical contact between the cathode electrode on the microLED and the P-pad electrode on the display (FIG. 11B). Heat 1010 is applied to form a solder bond and the stamp is withdrawn for cleaning and re-use. A dielectric coating 1106, such as a polyimide, is applied to fill the gaps between the microLED and the reflector wells, which prevents shorting and planarizes the surface for metallization (FIG. 11C). The conductive keels protrude from the insulating film forming self-aligned contact points to each microLED and the contact can be further improved by a short $O_2$ plasma etch to remove some of the dielectric coating. The circuit is completed by connecting the microLED posts to Vss (power) with a metal pattern as in FIG. 11D.

Figure 12A:
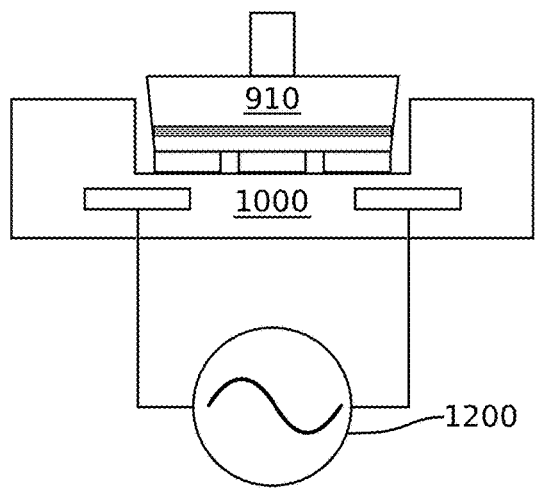
FIGS. 12A and 12B are partial cross-sectional views depicting a force generator used to aid in securing a microLED to a carrier substrate trap site.
Figure 12B:
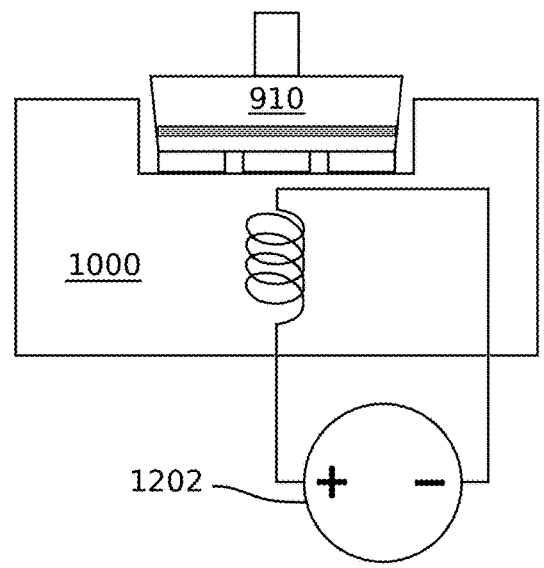

FIGS. 12A and 12B are partial cross-sectional views depicting a force generator used to aid in securing a microLED to a carrier substrate trap site. FIG. 12A uses an electrostatic force generator 1200 and FIG. 12B depicts the use of a magnetic force generator 1202. Although surface mount microLEDs are shown, the generators can also be used with vertical microLEDs.

Figure 13A:
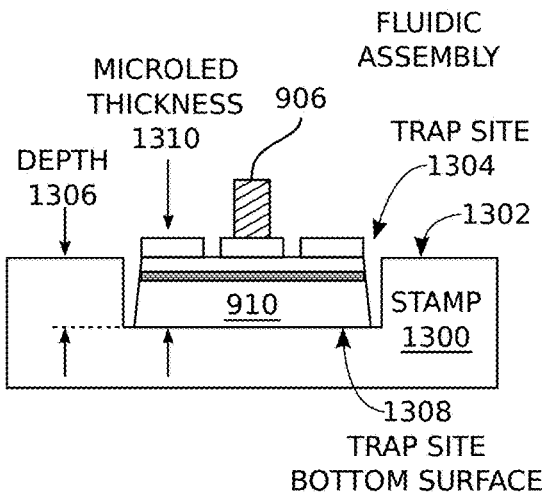
FIGS. 13A through 13K depict steps in a microLED mass transfer stamping system using a fluidic assembly stamp substrate.
Figure 13B:
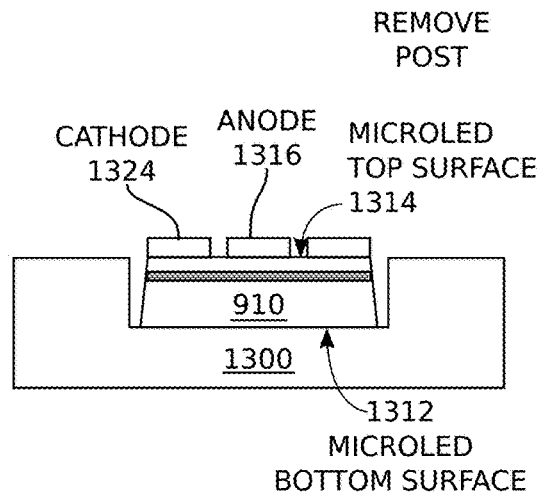
Figure 13C:
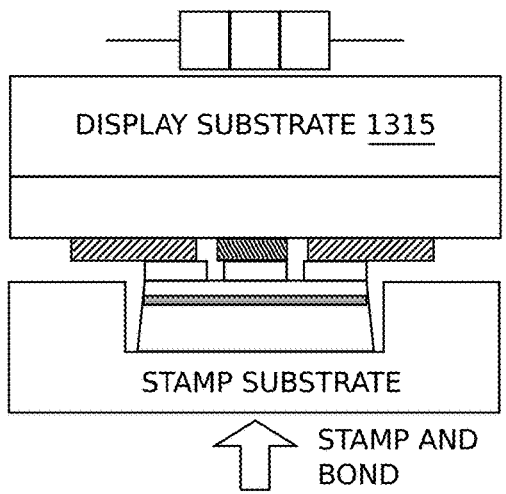

FIGS. 13A through 13K depict steps in a microLED mass transfer stamping system using a fluidic assembly stamp substrate. It would be desirable to further simplify the assembly process by using fluidic assembly to populate the stamp directly, thereby eliminating the carrier substrate. The microLED of FIG. 6 uses a keel structure, referred to as a securing mechanism below, on the bottom surface of the microLED to orient the microLED with the electrode in the bottom of the fluidic assembly trap sites. For the direct assembly process the electrodes must be oriented "up" in the stamp so the keel structure is fabricated on the microLED top surface as shown in FIG. 13A. Fluidic assembly is performed in the usual way to produce an array of microLEDs assembled in the trap sites with the keel and the electrode up. The material used for the keel structure is usually a photo patternable polyimide which can be removed by a solvent stripper or etched by an oxygen ($O_2$) plasma. Following assembly and drying, the keels are removed (FIG. 13B) so that the electrodes can be bonded to the display substrate. The stamp is fabricated in the same way as in the previously described embodiments, but the well structure must be impervious to the post removal process so organic films are not used and etching into the substrate to form the trap structures is preferred. The stamp as described holds microLEDs by gravity and Van der Waals forces, so microLEDs can fall out of the stamp if it is inverted. Thus, transfer assembly and bonding is carried out with the stamp face up and the display substrate is pressed downward onto the stamp while heating (FIG. 13C).

The fluidic assembly stamp substrate 1300 has a planar top surface 1302. An array of trap sites 1304 is formed in the stamp substrate top surface 1302 with a first perimeter shape, a depth 1306, and a planar trap site bottom surface 1308.

As in previous examples, the first perimeter shape is circular, but the system is not limited exclusively to such a shape. MicroLEDs 910 occupy the trap site 1304, having the first perimeter shape, a thickness 1310 greater than the trap site depth, a planar bottom surface 1312 interfaced to the trap site bottom surface 1308, a planar top surface 1314 extending out of the trap site with a first electrode 1316, and a securing mechanism (as explained below). The microLEDs have an electrical interface associated with a vertical microLED 1100 with a second electrode formed on the bottom surface 1312 (FIG. 13D) or a surface mount microLED 910 with first electrode 1316 and second electrodes 1324 formed on the top surface 1314 (FIGS. 13A and 13E).

As shown in FIG. 13A, the securing mechanism is a keel 906 formed on the microLED top surface that is temporary, electrically non-conductive keel, which is removed prior to interfacing with the display substrate 1315. Alternatively, as shown in FIGS. 13D and 13E, the securing mechanism may be an electrically conductive keel 906 connected to the first electrode 1316. In FIG. 13D the microLED is a vertical microLED 1100.

Figure 13E:
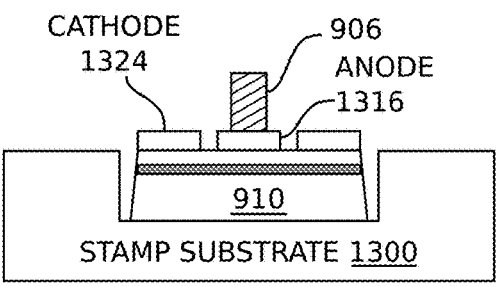
Figure 13D:
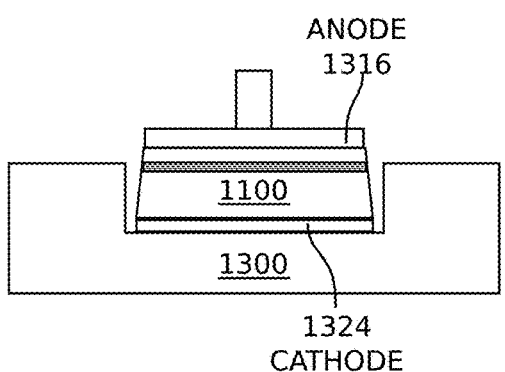
Figure 13F:
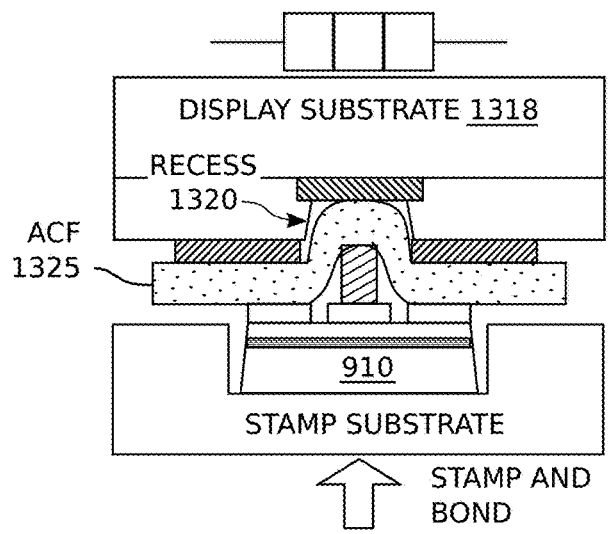

Another embodiment of the direct stamp transfer process replaces the non-conductive orientation keel with a conductive center post so the feature serves both as the orienting keel for fluidic assembly, but also as the anode electrode (FIG. 13E). In this case the stamp is a simple plate with trap structures arranged in an array at the pitch of display pixels. The display substrate 1318 is fabricated with the P-Pad electrode recessed below the level of the N-pad electrode to provide space for the conductive post forming the anode electrode on the microLED (FIG. 13F). Small differences in post height and P-pad recess depth can be expected due to process variations so the connection between the microLED and display substrate electrodes may be made using ACF 1325 to compensate for the differences.

Thus, the microLED of FIG. 13E is a surface mount microLED 910a, but the display substrate 1318 of FIG. 13F includes a recess 1320 to accommodate the conductive keel 906.

Figure 13G:
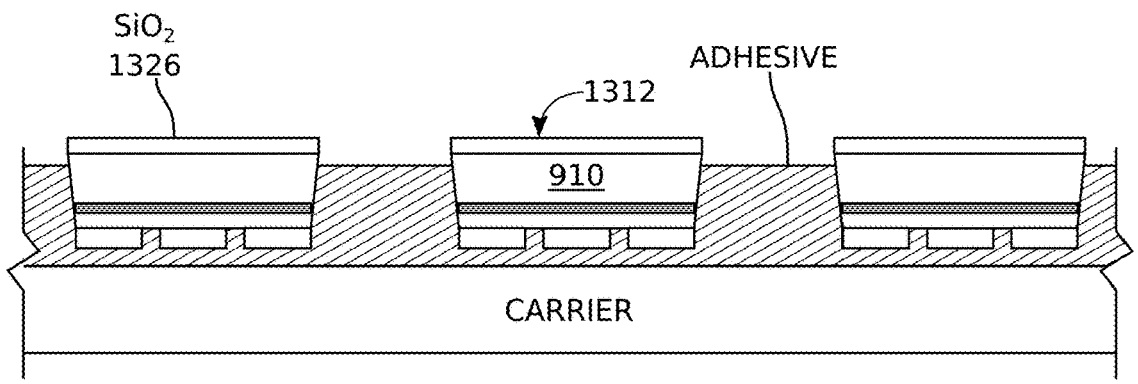
Figure 13H:
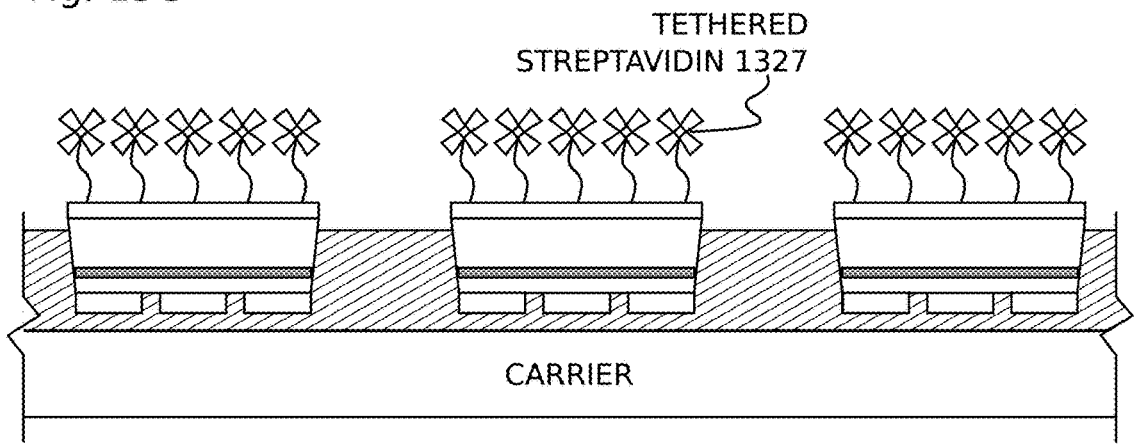
Figure 13I:
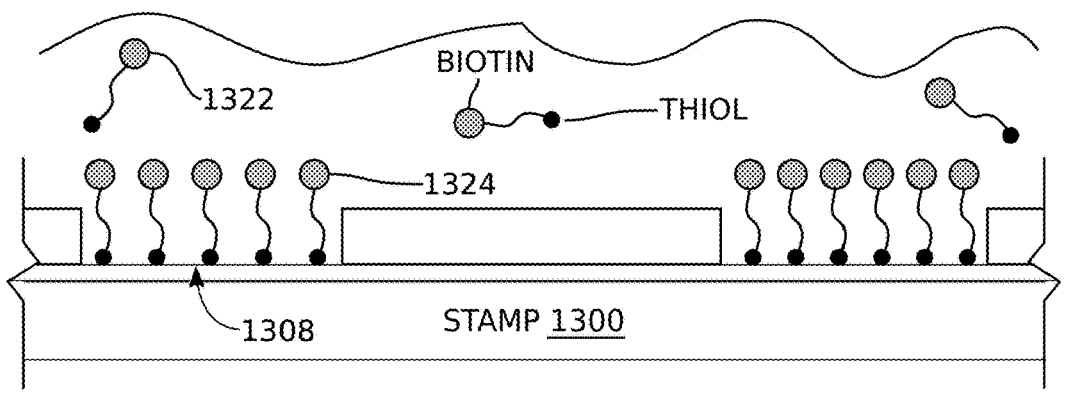
Figure 13K:
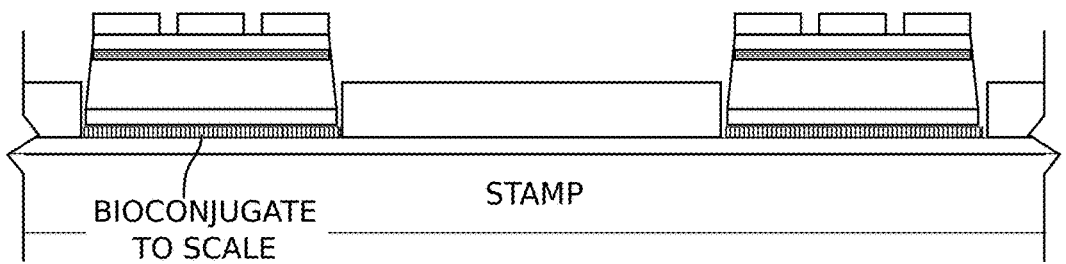

Another mechanism for orienting and holding microLEDs in the transfer stamp uses the preferential attachment between conjugated pairs of bio molecules such as the streptavidin-biotin pair. The microLEDs are prepared for functionalization by depositing a thin $SiO_2$ film 1326 on the back sides of the device 1312 after LLO as shown in FIG. 13G. The surface is exposed to hydrogen plasma or alkaline chemistry, then silanized with amine-terminated molecules such as 3-aminepropyl-trimethoxysilane. Washing the surface with a streptavidin solution bonds streptavidin molecules 1327 to the amine termination, resulting in a streptavidin-functionalized microLED (FIG. 13H). The trapping sites of the transfer stamp may be treated prior to assembly in a similar manner with biotin-terminated ligands, or the well bottom may be a gold surface which is exposed to a thiol-biotin bifunctional molecule 1322 as shown in FIG. 13I.

Figure 13J:
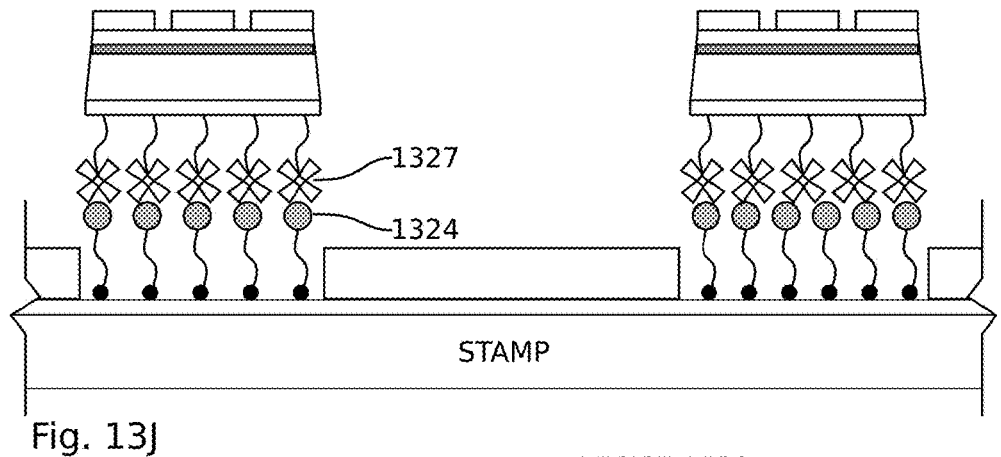

Thus, FIGS. 13G through 13K depict the microLED "securing mechanism" enabled as conjugated bio molecule pair. In this aspect, the stamp substrate trap site bottom surface 1308 is coated with a first component 1322 of a conjugated bio molecule pair. The microLED securing mechanism is a second component 1327 of the conjugated bio molecule pair coating each microLED bottom surface 1312. In assembly, the relatively low trap site depth (~1 μm), enables easy removal of misoriented microLEDs by fluidic perturbation, while correctly oriented microLEDs are chemically bound to the bottom of the trap site and well-registered by confinement in the trap site. In FIG. 13J the bioconjugate bond is shown with a vastly exaggerated z scale to illustrate the bonding effect. In practice the bonding layer is very thin as shown more accurately in FIG. 13K. Alternative chemical pairings to the example biotin-streptavidin system such as thiol-maleimide or Azide-alkyne may offer advantages in stability or processing ease but the fabrication sequence is similar.

Figure 14A:
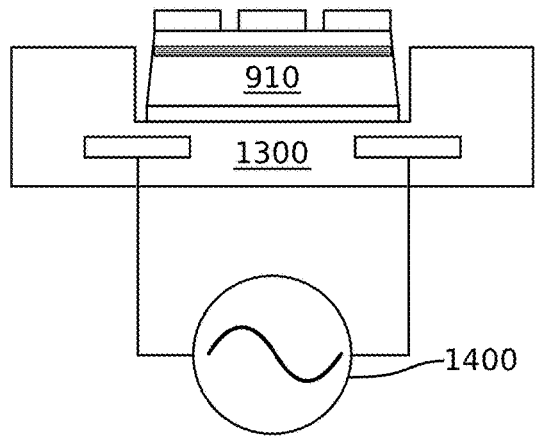
FIG. 14A depicts the use of an electrostatic force generator and FIG. 14B depicts the use of a magnetic force generator as secondary mechanisms to aid in securing microLEDs in the fluidic assembly trap sites.
Figure 14B:
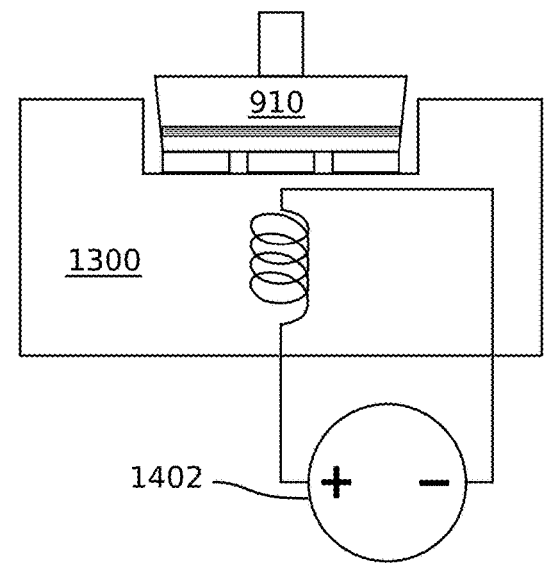

FIG. 14A depicts the use of an electrostatic force generator 1400 and FIG. 14B depicts the use of a magnetic force generator 1402 as secondary mechanisms to aid in securing microLEDs in the fluidic assembly trap sites (with or without a keel). In FIGS. 14A and 14B the primary securing mechanism may be gravity. Otherwise, in FIG. 14A the primary securing mechanism is conjugated bio molecules (not shown). Alternatively but not shown, the force generator in FIG. 14A may be magnetic and the force generator in FIG. 14B may be electrostatic. Although FIGS. 14A and 14B only show fluidic assembly stamp substrates, it should be understood that the force generators may also be used with recess-configured stamp substrates of FIGS. 4B-4D and 11A-11B.

At the cost of additional complexity some means of holding the microLEDs could be added to the stamp structure to prevent microLEDs from escaping the trap sites when the stamp is inverted. It is desirable that the holding force can be removed to release the microLEDs after bonding so adhesive attachment is not very attractive. Vacuum can be introduced to the stamp by making a porous layer between the substrate and the trap forming layer, but the liquid used for fluidic assembly can migrate into the pores and refuse to dry. The most practical structures to hold microLEDs incorporate magnetic or electrostatic forcing structures in the stamp. For electrostatic holding the microLED has a dielectric film deposited on the surface opposite the surface mount electrodes (i.e., the bottom surface) and the stamp incorporates powered electrodes below the trap structures. For magnetic holding the microLED electrode structure can incorporate a magnetic material such as nickel while the stamp would have permanent or electromagnets.

These holding mechanisms may be switchable for individual sites in the array so it is possible to use a sequence like the following to effect repair of a defective stamp:
1) Inspect the stamp looking for defective microLEDs;
2) Turn on holding force for all of the good microLEDs;
3) Rinse to remove defective microLEDs;
4) Dispense additional microLED suspension and carry out assembly.

In one aspect, the stamp can incorporate a photosensor, which when pressed to the display, energizes all sites (simultaneously or in series) that are in temporary electrical contact to the stamp's microLEDs. The stamp and associated drive circuits are connected to a system that records which microLEDs are good. A stamp holding force is energized to hang onto microLEDs in good sites and reassembly continues until 100% of the microLEDs are tested good as in Steps 2-4 above. Then, bonding progresses.

Figure 15A:
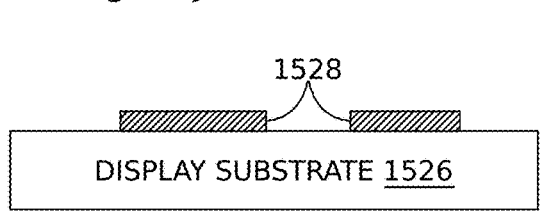
FIGS. 15A through 15I depict a microLED mass transfer stamping system using a fluidic stamp substrate and an axial lead microLED.
Figure 15B:
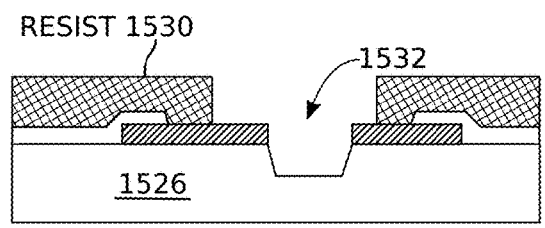
Figure 15C:
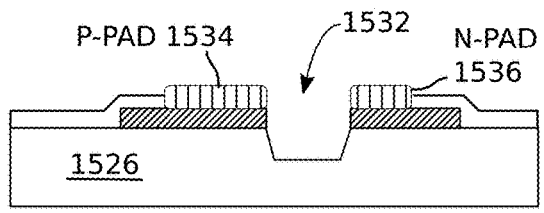
Figure 15D:
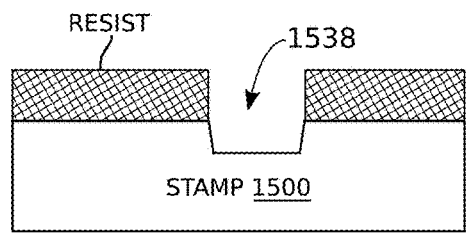
Figure 15E:
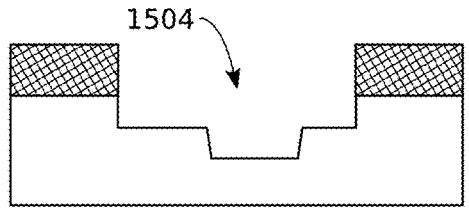
Figure 15F:
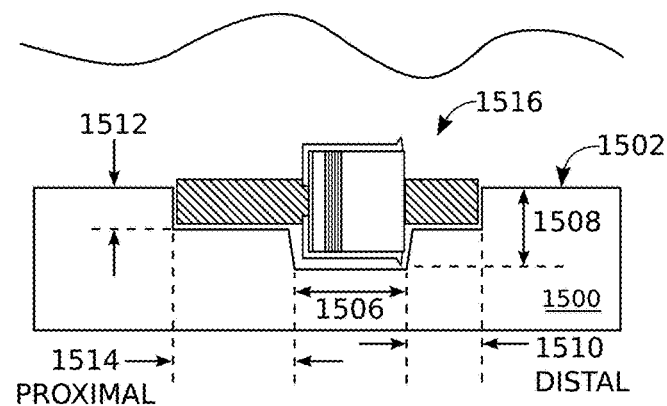
Figure 15G:
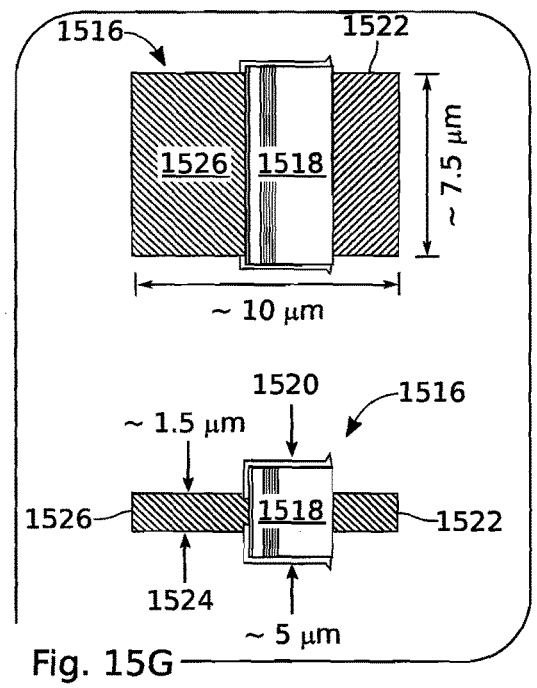
Figure 15H:
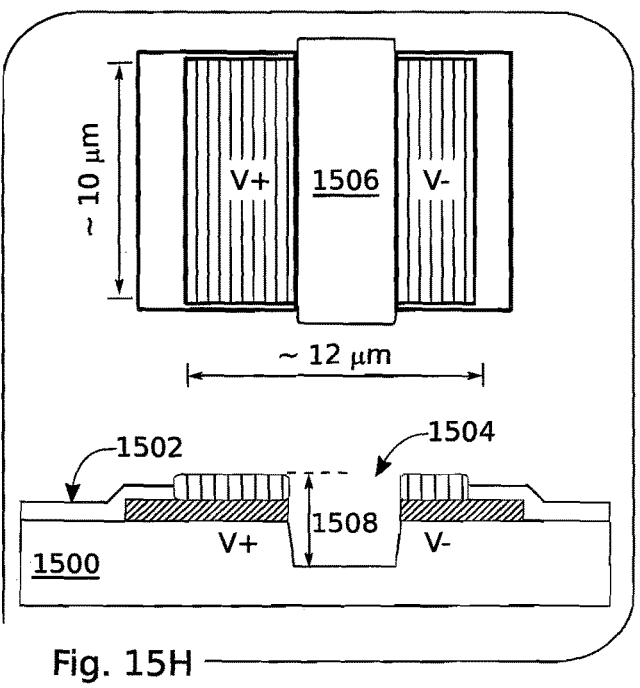

FIGS. 15A through 15I depict a microLED mass transfer stamping system using a fluidic stamp substrate and an axial lead microLED. The hybrid fluidic assembly mass transfer method can also be applied to the axial microLEDs described in application Ser. No. 16/846,493. For low cost and high density, the microLEDs are configured as vertical devices with an emission area of approximately 5×8 μm as shown in FIG. 15G. The blade shaped microLED electrodes may be of electroplated copper or gold. The sizes of all the features can be adjusted but the relative shape is important so that fluidic assembly results in an oriented array.

FIGS. 15A-15C depict the preparation of an axial lead microLED display substrate 1526. Electrodes 1528 are deposited and patterned of a conductive material such as molybdenum/copper (Mo/Cu) to form pads that accommodate the anode and cathode electrodes of the microLED. A dielectric thin film 1530 such as $SiO_2$, silicon nitride ($Si_3N_4$), or a polyimide is deposited over the electrodes and contact openings are patterned and etched as shown in FIG. 15B. Using the metal electrodes as a hard mask, the recess 1532 accommodating the microLED body is etched as shown in FIG. 15B. Finally the N-pad 1536 and P-pad 1534 electrodes are formed by plating, sputtering, or evaporation as shown in FIG. 15C.

For this microLED shape the stamp fabrication process is slightly more complex, requiring a trap site with two different depths. As shown in FIG. 15D a first recess 1538 is etched in the substrate with a depth and outline chosen to accommodate the microLED body projecting below the surface of the axial electrodes. In FIG. 15E a second recess 1504 to hold the axial electrodes is formed by etching. The second recess can also be formed from a thin film material such as photo patternable polyimide applied after the first recess is formed.

Figure 15I:
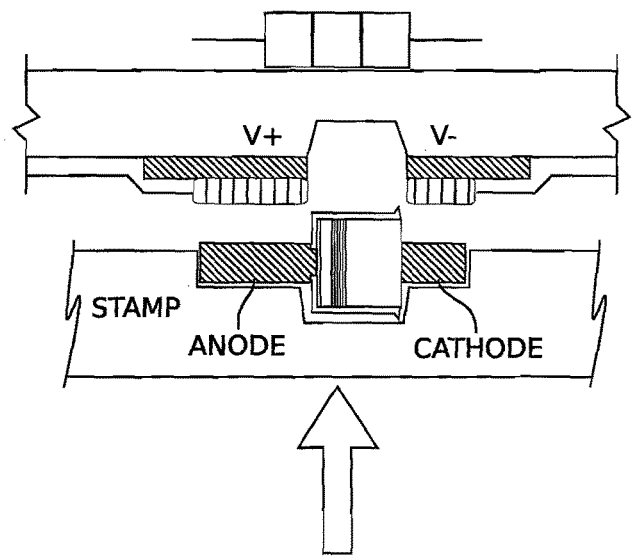

A suspension of known good axial electrode microLEDs is applied to the stamp and assembled to form an array of microLEDs (FIG. 15F). The resulting stamp is inspected, aligned with the display substrate and pressed together to bond the LED electrodes to the display electrodes (FIG. 15I). The stamp is withdrawn after bonding is complete and the stamp is cleaned and inspected for reuse.

Thus, the system comprises a fluidic assembly stamp substrate 1500 with a planar top surface 1502. An array of trap sites 1504 is formed in the stamp substrate top surface 1502 having a first perimeter shape (substantially rectangular), a center section 1506 with a planar first depth 1508, a distal end 1510 with a planar second depth 1512 less than the first depth, and a proximal end 1514 with the planar second depth.

An axial microLED 1516, see FIGS. 15F and 15G, occupies a corresponding trap site 1504 and has the first perimeter shape, a body 1518 interfaced with the trap site center section 1506, a vertical plane body thickness 1520 greater than the trap site first depth 1508, but less than 2× the trap site first depth. A distal electrode 1522 horizontally bisects the body 1518 and interfaces with the trap site distal end 1510. The distal electrode 1522 has a vertical plane electrode thickness 1524 greater than the trap site second depth 1512, but less than 2× the trap site second depth. A proximal electrode 1526 horizontally bisects the body and interfaces with the trap site proximal end 1514, having the electrode thickness 1524.

Transfer to the display substrate, shown in FIG. 15I, proceeds similarly to the process described in FIG. 13C with the aligned display substrate surface pressed down against the fluidically assembled stamp substrate surface to make contact between the microLED electrodes and the corresponding display substrate electrodes. Transfer and bonding is performed by heating the solder during the application of pressure. Optionally, an ACF film (not shown) may be interposed between corresponding electrodes to achieve electrical and mechanical connection without metal phase change.

Although not explicitly shown, the stamp substrate may incorporate electrostatic or magnetic force generators as shown in FIGS. 14A and 14B.

Figure 16:
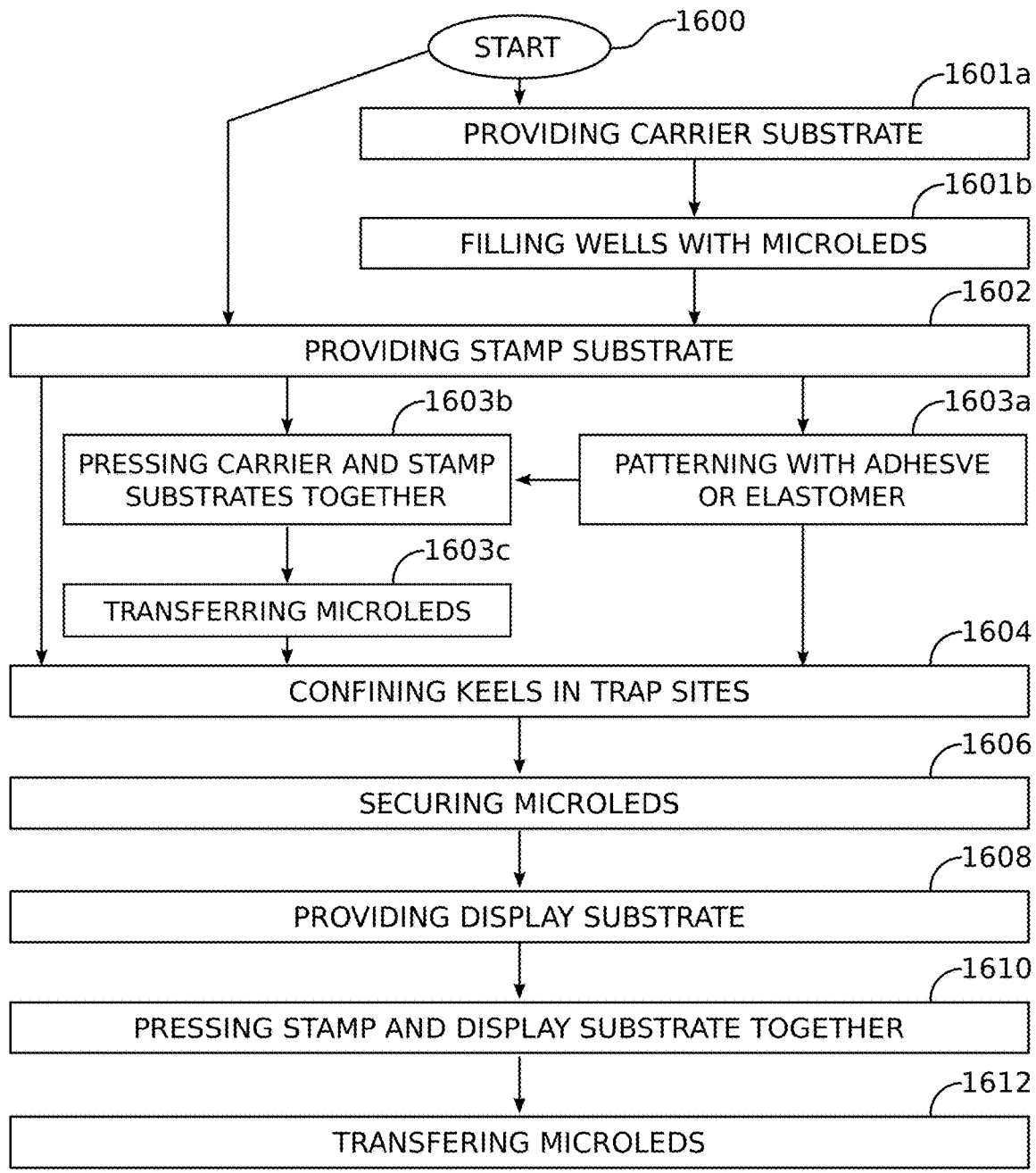
FIG. 16 is a flowchart illustrating a method for the mass transfer of microLEDs corresponding to the system presented in FIGS. 9A-9D.

FIG. 16 is a flowchart illustrating a method for the mass transfer of microLEDs corresponding to the system presented in FIGS. 9A-9D. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1600.

Step 1602 provides a stamp substrate with a planar top surface and an array of trap sites formed on the top surface, with each trap site configured as a columnar-shaped recess. In one aspect, Step 1603a patterns the top surface of the stamp substrate with an adhesive or an elastomer. In Step 1604, each trap site recess confines a keel extending from a microLED bottom surface, and in response to confining each microLED keel, Step 1606 secures the microLEDs to the stamp substrate. Step 1606 may secure the microLEDs to the stamp substrate using an additional electrostatic or magnetic force.

In one aspect, confining the keel in Step 1604 includes each trap site recess confining an electrically nonconductive keel of a surface mount LED having a planar top surface with a first electrode and a second electrode. Alternatively, Step 1604 confines an electrically conductive keel, connected to a second electrode, of a vertical LED having a planar top surface with a first electrode (i.e., the keel is the second electrode).

In one aspect, Step 1602 provides the stamp substrate with a pitch separating adjacent trap sites. Step 1601a provides a fluidic assembly carrier substrate having a planar top surface and an array of wells formed in the carrier substrate top surface having a pitch separating adjacent wells that matches the stamp substrate pitch between trap sites. Step 1601b, using a fluidic assembly process, fills the carrier substrate wells with microLEDs. In one aspect, Step 1601b secures the microLEDs in the wells using a electrostatic or magnetic force. Step 1603b presses the stamp substrate top surface against the carrier substrate top surface, with each trap site interfacing a corresponding well, and Step 1603c mass transfers the microLEDs from the carrier substrate to the stamp substrate.

More explicitly, Step 1601a may provide a carrier substrate with wells having a first perimeter shape and a planar well bottom surface. Then, filling the carrier substrate wells with the microLEDs in Step 1601b includes filling the wells with surface mount microLEDs having the first perimeter shape, and a planar top surface interfacing a corresponding well bottom surface, with a first electrode and a second electrode. Alternatively, Step 1601b fills the carrier substrate wells with vertical microLEDs having the first perimeter shape, and a planar top surface interfacing a corresponding well bottom surface, with a first electrode.

In the case of an RGB display, providing the carrier substrate in Step 1601a includes providing:

a first fluidic assembly carrier substrate with an array of wells formed in the carrier substrate top surface having a pitch separating adjacent wells matching the pitch separating the carrier substrate trap sites;

a second fluidic assembly carrier substrate with an array of wells formed in the carrier substrate top surface having a pitch separating adjacent wells matching the pitch separating the carrier substrate trap sites; and, a third fluidic assembly carrier substrate with an array of wells formed in the carrier substrate top surface having a pitch separating adjacent wells matching the pitch separating the carrier substrate trap sites. Then, filling the carrier substrate wells in Step 1601b includes:

filling the first carrier substrate wells with first microLEDs configured to emit light in a first wavelength;

filling the second carrier substrate wells with second microLEDs configured to emit light in a second wavelength; and, filling the third carrier substrate wells with third microLEDs configured to emit light in a third wavelength. Transferring the microLEDs from the carrier substrate to the stamp substrate in Step 1603c includes transferring the microLEDs from the first, second, and third carrier substrates to corresponding stamp substrates. As shown in FIGS. 10A and 10B, different sized carrier substrates may be necessary if the RGB microLEDs have different shapes. Otherwise, if the RGB microLED dimensions are the same, a single carrier substrate could be sequentially filled with different wavelength microLEDs, which are then sequentially transferred to a stamp substrate.

Step 1608 provides a display substrate having a planar top surface and an array of microLED pads, with each microLED pad including at least one electrode formed in the top surface and electrically connected to an underlying enablement matrix of column and row control lines. The display substrate has a pitch separating adjacent pad sites matching the pitch separating the stamp substrate trap sites, as well as the pitch separating carrier substrate wells. Step 1610 presses the stamp substrate top surface against the display substrate top surface, with each trap site interfacing a corresponding microLED site. Step 1612 mass transfers the microLEDs from the stamp substrate to the display substrate microLED pads. In one aspect, Step 1612 heats the display substrate to bond the microLEDs to the microLED pads.

In the case of an RGB display, Step 1608 provides a display substrate with pads for a plurality of first microLEDs configured to emit a first wavelength of light, a plurality of pads for second microLEDs configured to emit a second wavelength of light, and a plurality of pads for third microLEDs configured to emit a third wavelength of light. Then, pressing the stamp substrate top surface against the display substrate top surface in Step 1610 includes sequential pressing stamp substrates occupied by the first microLEDs, followed by the second microLEDs, followed by the third microLEDs. Separate stamp substrates may be used for each microLED wavelength, or if all the microLEDs are similarly shaped, the same stamp substrate may be sequentially filled with different wavelength microLEDs, which are then transferred to the display substrate.

Figure 17:
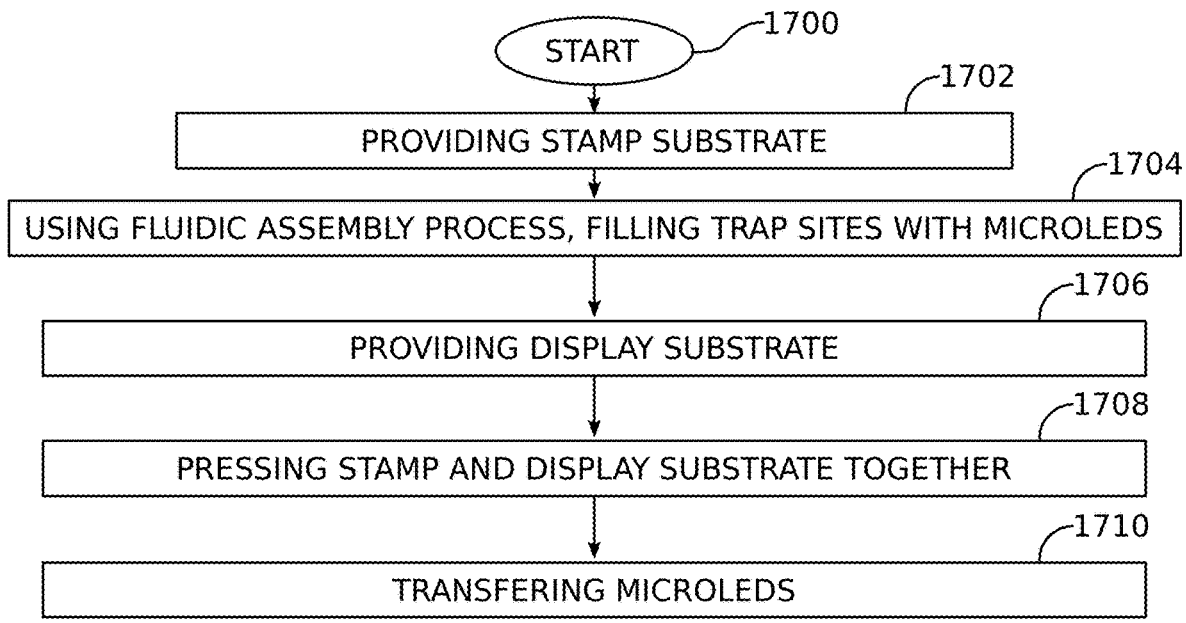
FIG. 17 is a flowchart illustrating a method for the mass transfer of microLEDs using a fluidic assembly stamp substrate as presented in the explanation of FIGS. 13A-13K.

FIG. 17 is a flowchart illustrating a method for the mass transfer of microLEDs using a fluidic assembly stamp substrate as presented in the explanation of FIGS. 13A-13K. The method begins at Step 1700. Step 1702 provides a fluidic assembly stamp substrate with a planar top surface, with trap sites formed in the top surface having a first perimeter shape, a depth, and a planar trap site bottom surface. Using a fluidic assembly process, Step 1704 fills the trap sites with microLEDs having the first perimeter shape, a thickness greater than the trap site depth, a planar bottom surface interfaced to the trap site bottom surface, and a planar top surface extending out of the trap site with a first electrode. The microLEDs also include a securing mechanism. Step 1704 fills the trap sites with either vertical microLEDs with a second electrode formed on the bottom surface or surface mount microLEDs with first and second electrodes formed on the top surface.

In one aspect, providing the stamp substrate in Step 1702 includes providing the stamp substrate with a pitch separating adjacent trap sites. Step 1706 provides a display substrate having a planar top surface and an array of microLED pads, where each microLED pad includes a first electrode formed in the top surface electrically connected to an underlying enablement matrix of column and row control lines. The display substrate has a pitch separating adjacent pad sites matching the pitch separating the stamp substrate trap sites. Step 1708 presses the stamp substrate top surface against the display substrate top surface, with each trap site interfacing a corresponding microLED site. Step 1710 mass transfers the microLEDs from the stamp substrate to the display substrate microLED pads. Step 1710 may include the use of heat to promote bonding between the microLEDs and the display substrate pads.

In one aspect, Step 1704 provides the securing mechanism in the form of a keel formed on the microLED top surface, which may be an electrically conductive keel connected to the first electrode (FIGS. 13D and 13E) or a temporary (removable), electrically nonconductive keel (FIG. 13A). Alternatively, Step 1702 provides the stamp substrate with each trap site bottom surface coated by a first component of a conjugated bio molecule pair coating each trap site bottom surface. Then, the securing mechanism mentioned in Step 1704 is a second component of the conjugated bio molecule pair coating each microLED bottom surface. Examples of conjugated bio molecules include biotin-streptavidin, thiol-maleimide, and azide-alkyne. The stamp substrate may further incorporate magnetic or electrostatic force generators, such as shown in FIGS. 14A and 14B.

Figure 18:
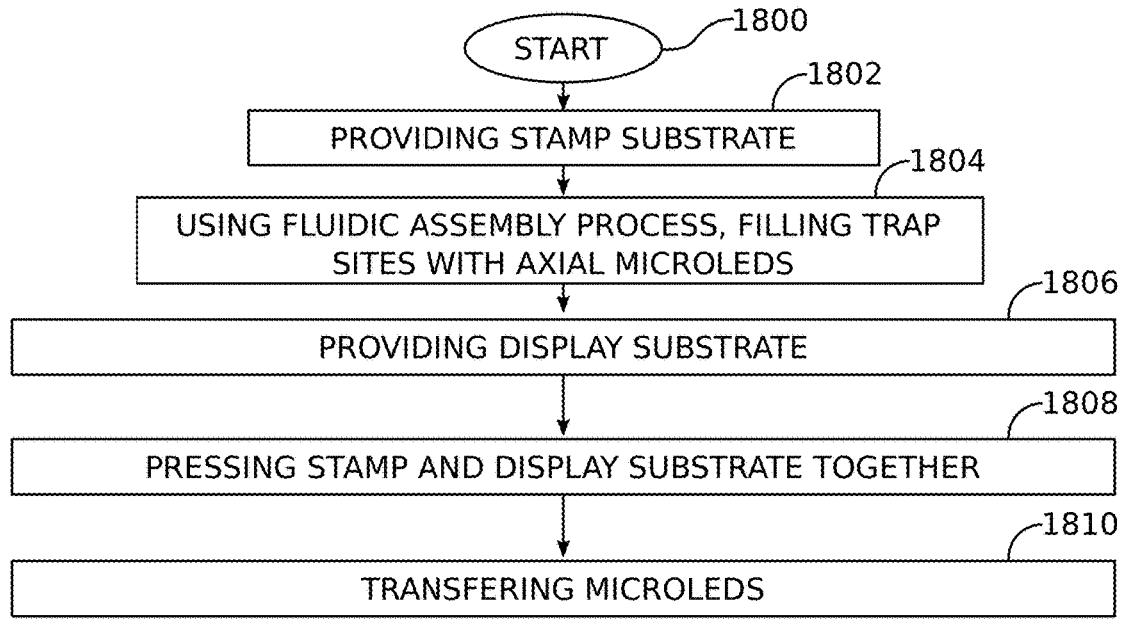
FIG. 18 is a flowchart illustrating a method for the mass transfer of axial microLEDs corresponding to the system explained with FIGS. 15A-15I.

FIG. 18 is a flowchart illustrating a method for the mass transfer of axial microLEDs corresponding to the system explained with FIGS. 15A-15I. The method starts at Step 1800. Step 1802 provides a fluidic assembly stamp substrate having a planar top surface, with trap sites formed in the top surface having a first perimeter shape, a center section with a planar first depth, a distal end with a planar second depth less than the first depth, and a proximal end with the planar second depth. Using a fluidic assembly process, Step 1804 fills the trap sites with axial microLEDs, each occupying a corresponding trap site and having the first perimeter shape, a body interfaced with the trap site center section having a vertical plane body thickness greater than the trap site first depth, but less than 2× the trap site first depth. The microLEDs have a distal electrode horizontally bisecting the body and interfaced with the trap site distal end, with a vertical plane electrode thickness greater than the trap site second depth, but less than 2× the trap site second depth. The microLEDs have a proximal electrode horizontally bisecting the body and interfaced with the trap site proximal end, with the electrode thickness. In one aspect, the stamp substrate may further incorporate magnetic force generators, such as shown in FIGS. 14A and 14B.

In one aspect, providing the stamp substrate in Step 1802 includes providing the stamp substrate with a pitch separating adjacent trap sites. Step 1806 provides a display substrate having a planar top surface and an array of microLED pads, where each microLED pad includes a first electrode formed on the top surface and a second electrode formed on the top surface, with the electrodes electrically connected to an underlying enablement matrix of column and row control lines. The display substrate has a pitch separating adjacent pad sites matching the pitch separating the stamp substrate trap sites. Step 1808 presses the stamp substrate top surface against the display substrate top surface, with each trap site interfacing a corresponding microLED site. Step 1810 mass transfers the microLEDs from the stamp substrate to the display substrate microLED pads. Optionally, heat may be used to promote bonding between microLED and display substrate pad electrodes.

Figure 19:
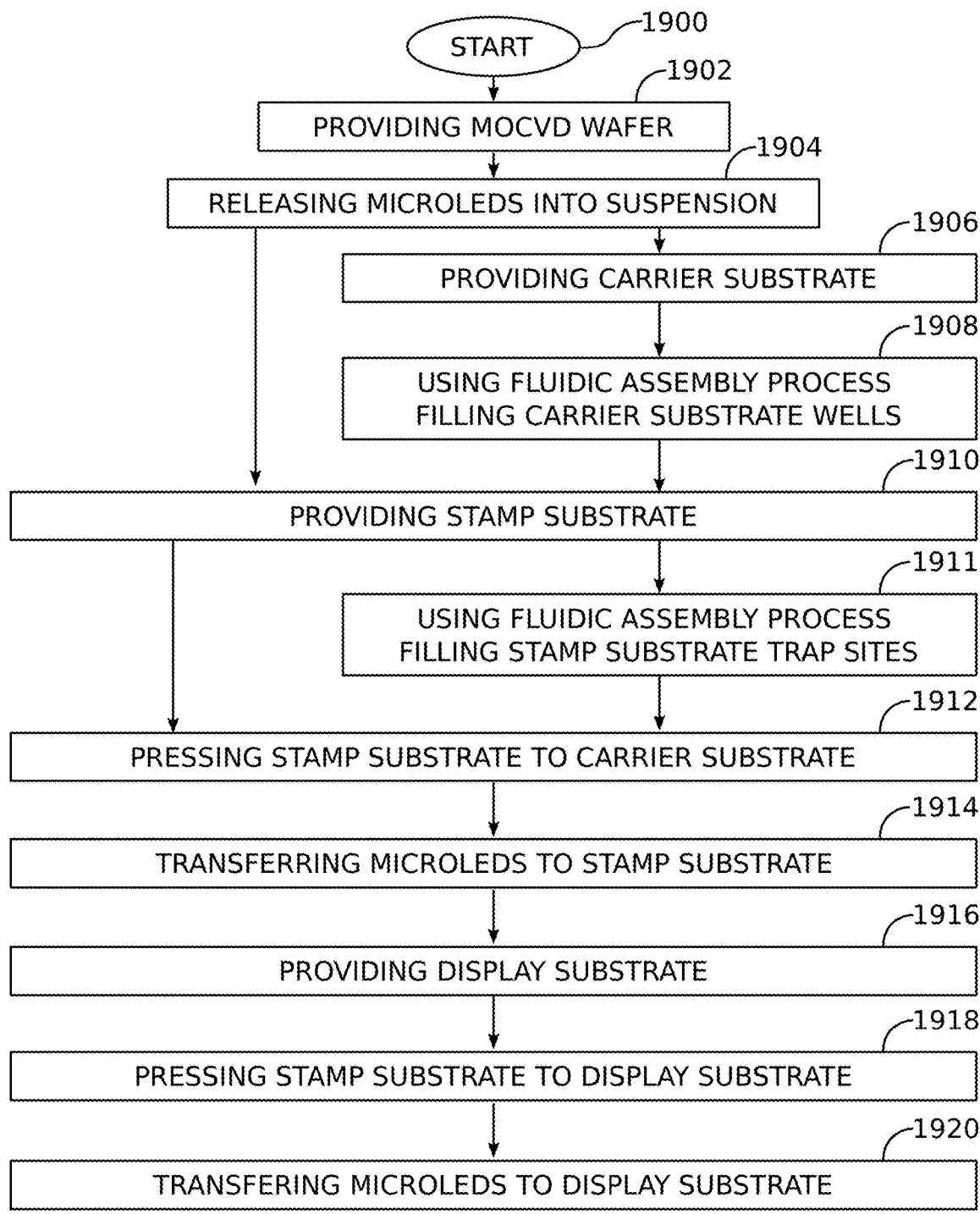
FIG. 19 is a flowchart illustrating a pitch expansion method for the transfer of microLEDs.

FIG. 19 is a flowchart illustrating a pitch expansion method for the transfer of microLEDs. The method starts at Step 1900. Step 1902 provides a microLED MOCVD wafer with a first pitch between adjacent microLEDs. Step 1904 releases the microLEDs into a fluidic assembly suspension. Step 1906 provides a carrier substrate comprising an array of wells, where a second pitch separates adjacent wells, and where the second pitch is different than the first pitch. Using a fluidic assembly process, Step 1908 fills the carrier substrate wells with microLEDs. Step 1910 provides a stamp substrate with an array of trap sites, where the second pitch separates adjacent trap sites. Step 1912 presses the stamp substrate top surface against the carrier substrate top surface, with each trap site interfacing a corresponding well. Step 1914 mass transfers the microLEDs from the carrier substrate to the stamp substrate trap sites.

Step 1916 provides a display substrate having an array of microLED pads, where each microLED pad includes at least a first electrode formed on the top surface electrically connected to an underlying enablement matrix of column and row control lines. The display substrate has the second pitch separating adjacent pad sites. Step 1918 presses the stamp substrate top surface against the display substrate top surface, with each trap site interfacing a corresponding microLED pad site. Step 1920 mass transfers the microLEDs from the stamp substrate to the display substrate microLED pads. Optionally, heat may be used to promote bonding between microLED and display substrate pad electrodes.

In one aspect, Steps 1906, 1908, 1912, and 1914 are bypassed, and an addition step, Step 1911, uses a fluidic assembly process to fill the stamp substrate traps sites with microLEDs.

Systems and methods have been provided for the mass transfer of microLEDs. Examples of particular LED, carrier substrate, and stamp substrate structures have been presented to illustrate the invention. However, the invention is not limited to merely these examples. Other variations and embodiments of the invention will occur to those skilled in the art.

We claim:

1. A micro light emitting diode (microLED) mass transfer method, the method comprising:
fabricating microLEDs on a wafer;
forming a keel extending from an exposed bottom surface of each microLED;
releasing the microLEDs from the wafer into a suspension;
fluidically depositing the microLEDs onto a carrier substrate having a planar top surface and an array of wells formed in the carrier substrate top surface;
transferring the microLEDs on the carrier substrate to a mass transfer stamp by pressing a top surface of the mass transfer stamp substrate against the carrier substrate top surface, with an array of mass transfer stamp capture sites formed in the mass transfer stamp top surface interfacing with corresponding microLEDs in carrier substrate wells; and, transferring the microLEDs from the mass transfer stamp to a display substrate.

2. The method of claim 1 wherein the carrier substrate wells have a first perimeter shape and a planar well bottom surface; and, wherein fluidically depositing the microLEDs onto the carrier wafer includes filling the wells with microLEDs having the first perimeter shape.

3. The method of claim 1 wherein the carrier substrate array of wells has a pitch separating adjacent wells; and, wherein the mass transfer stamp array of capture sites has a pitch that is greater than or equal to the array of carrier substrate wells.

4. The method of claim 1 wherein transferring the microLEDs from the carrier substrate to the mass transfer stamp includes configuring the mass transfer stamp capture sites to accept the microLED keels.

5. The method of claim 4 wherein configuring the mass transfer stamp capture sites to accept the microLED keels includes configuring the transfer stamp capture sites to comprise capture site columnar-shaped recesses accepting the microLED keels.

6. The method of claim 1 further comprising:
prior to the fluidic deposition of the microLEDs onto the carrier substrate, coating carrier substrate well bottom surfaces with a first component of a conjugated bio molecule pair; and, while in the suspension, coating the microLEDs with a second component of the conjugated bio molecule pair.

7. The method of claim 1 further comprising:
prior to transferring the microLEDs from the carrier substrate to the mass transfer stamp, using a force generator underlying the carrier substrate, selected from the group consisting of a magnetic force generator and an electrostatic force generator, to temporarily secure the microLEDs in the carrier substrate wells.

8. A micro light emitting diode (microLED) mass transfer method, the method comprising:
fabricating microLEDs on a wafer;
releasing the microLEDs from the wafer into a suspension;
coating carrier substrate well bottom surfaces with a first component of a conjugated bio molecule pair;
while in the suspension, coating the microLEDs with a second component of the conjugated bio molecule pair;
fluidically depositing the microLEDs onto the carrier substrate having a planar top surface and an array of wells formed in the carrier substrate top surface;
transferring the microLEDs on the carrier substrate to a mass transfer stamp by pressing a top surface of the mass transfer stamp substrate against the carrier substrate top surface, with an array of mass transfer stamp capture sites formed in the mass transfer stamp top surface interfacing with corresponding microLEDs in carrier substrate wells; and,
transferring the microLEDs from the mass transfer stamp to a display substrate.

\* \* \* \* \*